United States Patent [19]
Luby et al.

[11] Patent Number: 6,081,909
[45] Date of Patent: Jun. 27, 2000

[54] IRREGULARLY GRAPHED ENCODING TECHNIQUE

[75] Inventors: Michael G. Luby, Berkeley, Calif.; Mohammad Amin Shokrollahi, Rappweiler, Germany; Volker Stemann, Frankfurt, Germany; Michael D. Mitzenmacher, Milpitas, Calif.; Daniel A. Spielman, Cambridge, Mass.

[73] Assignee: Digital Equipment Corporation, Maynard, Mass.

[21] Appl. No.: 08/965,603

[22] Filed: Nov. 6, 1997

[51] Int. Cl.$^7$ ................................................. G06F 11/00
[52] U.S. Cl. ................................................. 714/701
[58] Field of Search ............................... 714/701

[56] References Cited

U.S. PATENT DOCUMENTS

| | | | |
|---|---|---|---|
| 4,958,348 | 9/1990 | Berlekamp et al. | 371/42 |
| 5,115,436 | 5/1992 | McAuley | 371/35 |

OTHER PUBLICATIONS

Zyablov et al., Decoding Complexity of Low–Density Codes for Transmission in a Channel with Erasures—vol. 10, No. 1, pp. 10–21, last revision Aug. 20, 1973.

R. Michael Tanner, A Recursive Approach to Low Complexity Codes—Transactions on Information Theory, vol. IT–27, No. 5, Sep. 1981, pp. 533–547.

Jung–Fu Cheng, On the Construction of Efficient Multilevel Coded Modulations—IEEE Intl. Symposium on Information Theory, 1997, pp. 1–12.

MacKay et al., Good Codes based on Very Sparse Matrices—Cavendish Labs, Cambridge, U.K., 7 pages.

Alon et al., Construction of Asymptotically Good Low–Rate Error–Correcting Codes through Pseudo Random Graphs—IEEE Trans. on Information Theory, vol. 38, No. 2, Mar. 1992, pp. 509–516.

Cheng et al., Some High–Rate Near Capacity Codes for the Gaussian Channel—34th Allerton Conference on Communications, Control and Computing, Oct. 4, 1996, pp. 1–10.

Gelfand et al., On the Complexity of Coding—2nd Intl. Symposium on Information Theory, Tsahkadsor Armeia, USSR, Sep. 2–8, 1971, pp. 177–184.

Bassalygo et al., Problems of Complexity in the Theory of Correcting Codes—Plenum Publishing Corp., 1978, pp. 166–175.

Vvedenskaya et al., Systematic Codes That Can Be Realized by Simple Circuits—Plenum Publishing Corp., 1979, 246–254.

A. J. McAuley, Reliable Boardband Communication Using a Burst Erasure Correcting Code—Computer Communication Research Group, Morristown, NJ, pp. 297–306.

(List continued on next page.)

*Primary Examiner*—Phung M. Chung
*Attorney, Agent, or Firm*—Jenkens & Gilchrist,P.C.

[57] ABSTRACT

A method of encoding a message including a plurality of data items, includes identifying maximum and minimum numbers of first edges to be associated with data items. A first distribution of different numbers of first edges, ranging from the maximum to the minimum number of first edges, to be associated with the data items is computed. A first associated number of first edges, within the range, is established for each data item, the different numbers of first edges being associated with the data items according to the computed first distribution. A maximum and minimum number of second edges to be associated with redundant data items are identified. A second distribution of numbers of second edges, ranging from the maximum to the minimum number of second edges, to be associated with the redundant data items is computed. An associated number of second edges, within the range, is established for each redundant data item, the different numbers of second edges being associated with the redundant data items according to the determined second distribution. A threshold number of potentially lost/corrupted data items is established. An encoded message is formed with the redundant data items associated with the data items according to the first distribution and with the data items associated with the redundant data items according to the second distribution only if the number of data items which are recoverable or correctable exceeds the threshold.

35 Claims, 25 Drawing Sheets

OTHER PUBLICATIONS

E. W. Biersack, Performance Evaluation of Forward Error Correction in ATM Networks—Institut EURECOM, France, Aug. 1992, pp. 248–257.

David J.C. MacKay, Good Error–Correcting Codes based on Very Sparse Matrices—Cavendish Labs, U.K. Nov. 2, 1996, pp. 1–50.

Daniel A. Spielman, Linear–Time Encodable and Decodable Error–Correcting Codes—Dept. of Computer Science, U.C. Berkeley, Berkeley, CA, pp, 1–20.

Sipser et al., Expander Codes—Massachusetts Institute of Technology, Cambridge, MA,, 12 pages.

G. David Forney, Jr., The Forward–Backward Algorithm—Motorola, Inc., Mansfield, MA, Oct. 1, 1986, pp. 432–446.

R. G. Gallager, Low–Density Parity–Check Codes—1963, M.I.T. Press, Cambridge, MA, 106 pages.

Sipser et al., Expander Codes—Journal Version, IEEE IT 1996, Massachusetts Institute of Technology, pp. 1–28.

Daniel A. Spielman, Linear–Tim Encodable and Decodable Error–Correcting Codes—Conference Version, STOC 95, Massachusetts Institute of Technology, 10 pages.

Daniel A. Spielman, Linear–Tim Encodable and Decodable Error–Correcting Codes—Journal Version, IEEE IT 96, Massachusetts Institute of Technology, pp. 1–20.

Daniel A. Spielman, Computationally Efficient Error–Correcting Codes and Holographic Proofs—Yale University (1992), Massachusetts Institute of Technology Jun. 1995, pp. 1–147.

Luigi Rizzo—Effective erassure codes for reliable computer communication protocols—University of Italy, Jan. 9, 1997, pp. 1–10.

Luigi Rizzo,—A Reliable Multicast data Distribution Protocol based on software FEC techniques—University of Italy, Feb. 20, 1997, pp. 1–6.

Luigi Rizzo—On the feasibility of software FEC—University of Italy, Jan. 31, 1997, pp. 1–16.

IRREGULARLY GRAPHED ENCODING TECHNIQUE

TECHNICAL FIELD

The present invention relates to loss resilient and error correcting codes and, more particularly, to a technique for creating loss resilient and error correcting codes having irregular graphing between the message data and the redundant data.

BACKGROUND ART

In downloading data from storage or communicating data, for example over a communications network such as the INTERNET, data is transmitted in streams of message packets. Typically, the message packets each contain a word of, for example, 16, 32 or 64 bits. The packets are combined into a message or message segment for transmission.

During transmission of the message, various transmission related factors can result in message packets being lost or the data contained therein being altered so as to be in error, causing the communication to be corrupted at the receiving end. Stored data may also be lost or suffer error due to, for instance, static electrical charges in the environment or other factors. Numerous techniques are in use or have been proposed for replacing lost packets of information and correcting erroneous message data after the communication has been received. Such conventional techniques include Fourier transform-based techniques such as BCH and Reed-Solomon codes.

Conventional techniques for protecting information from loss or errors involve encoding the information before it is transmitted in such a way that, even if it is partially lost or corrupted during transmission, the original information can be recovered. The encoding process necessarily involves the addition of extra, redundant data to the information. This redundant information is gathered together with the original information to form the message that is transmitted. The process of determining the original information, given the received corrupted message, i.e. a message with either losses or errors, is called decoding. Two criteria by which these techniques are evaluated are: how much additional data must be added to achieve reliable communications given a certain expected amount of loss or corruption, and how long it takes to perform the processes of encoding and decoding.

The original information is represented by data items, which are also commonly referred to as message symbols. The data items could for example be message packets or data bits. The redundant data that is also transmitted with the information is represented by redundant data items, which are commonly referred to as check symbols. The redundant data items are of the same type as the data items. For example, if the data items are packets, then the redundant data items are also packets. The collection of data items and redundant data items that is transmitted is called a codeword. In the field of Coding Theory, each corruption of a data item is either called a loss, often referred to as an erasure, or an error. When trying to ascertain the information, the receiver will only have access to a corrupted version of the codeword.

The decoding overhead of a loss-resilient technique at a particular stretch factor is given by that stretch factor divided by the least stretch factor of any code that can reliably recover from the maximum number of losses reliably recoverable by the technique at the particular stretch factor, less 1. Using Reed-Solomon techniques, the decoding overhead is zero. Loss resilient techniques with a decoding overhead of zero are judged by their time overheads, i.e. the time required to encode and decode expressed as a multiple of the total number of data items and redundant data items. To the extent the use of any technique would result in a decoding overhead greater than zero, this added inefficiency must be compensated for by a reduction in the time overhead to provide a total efficiency equivalent to or better than those techniques having a zero decoding overhead.

While superior to other loss-resilient techniques, Fourier transform-based techniques still require a substantial time overhead to perform. Hence, even using a Fourier transform-based technique, there can be a bottleneck at the receiving end due to the time required to replace lost packets. For example, if the number of packets being communicated is 100,000, the time overhead will typically exceed 1,000. The more packets requiring replacement the higher the time overhead.

The situation is similar for error correcting techniques. However, the decoding overhead of an error correcting technique is determined by the entropy function of Information Theory. For example, if the number of redundant data items is to be equal to the number of data items, and those data items and redundant data items are bits, then no technique can reliably recover all data items if more than 11% of the data items and redundant items are corrupted by errors. Proposed prior art error correction techniques are unable to both efficiently and reliably recover from a full 11% error rate, but are generally capable of recovering from errors in approximately 8% of the data items and redundant data items.

While the deficiencies of prior art loss-resilient and error correcting techniques are generally tolerable for transmissions of relatively short lengths, these deficiencies become less acceptable during transmissions of large quantities of data. In applications requiring transmission of messages having large quantities of data items, such as video signal transmission, the probability that all corrupted data items can be recovered is at best low using conventional techniques.

Further, where large blocks of data are being transmitted at high speed, for example, in video distribution, the time required to recover any corrupted data needs to be minimized. The time performance of conventional techniques is generally insufficient to make the necessary recoveries in the required real time periods, unless specialized hardware is provided.

Accordingly, a need exists for data recovery techniques which can be utilized for quickly recovering corrupted data items where large blocks of data items must be transmitted.

OBJECTIVES OF THE INVENTION

Accordingly, it is an objective of the present invention to provide a technique for creating loss resilient and error correcting codes which substantially reduce the time required to encode and decode messages.

It is another object of the present invention to provide a technique for creating encoded messages which, when decoded, facilitate recovery and/or correcting of message data which has been lost or corrupted during transmission or storage.

It is yet another objective of the present invention to provide a technique for creating encoded messages which, when decoded, facilitate recovery and/or correction of a large number of lost or corrupted data items with improved efficiency.

It is a further object of the present invention to provide a technique for creating encoded messages which, when decoded, facilitate recovery of corrupted data items with high probability.

Additional objects, advantages, novel features of the present invention will become apparent to those skilled in the art from this disclosure, including the following detailed description, as well as by practice of the invention. While the invention is described below with reference to preferred embodiment(s), it should be understood that the invention is not limited thereto. Those of ordinary skill in the art having access to the teachings herein will recognize additional implementations, modifications, and embodiments, as well as other fields of use, which are within the scope of the invention as disclosed and claimed herein and with respect to which the invention could be of significant utility.

SUMMARY DISCLOSURE OF THE INVENTION

In accordance with the present invention, a method is provided for encoding a message having a plurality of data items, e.g. message packets or data bits, by identifying a maximum and minimum number of first edges to be associated with the data items. Preferably, the minimum number of first edges is 2. The numbers are different positive integer values. A first distribution of different numbers of first edges, ranging from the maximum to the minimum, to be associated with the plurality of data items is computed. An associated number of first edges, within the range, is established for each data item. The associated numbers are established so that the different numbers of first edges are associated with the data items according to the computed first distribution.

The first distribution of numbers of first edges can be computed by $2^i+1$, where i is a number of first edges within the range of different numbers of first edges. For example, the different numbers of first edges might include 3, 5, 9, 17 and 33. Alternatively, the different numbers of first edges could be distributed equally. In a still further and most preferred alternative, the maximum number of first edges is set equal to D+1. A constant N is set equal to 1+1/D. The distribution of numbers of first edges is computed by N/i (i−1).

Preferably, prior to creating the encoded message, those data items to which each of the redundant data items will correspond are randomly selected. The encoded message will preferably include multiple levels of redundant data items. Preferably, the number of data items will exceed the number of redundant data items which are edged directly to the data items.

In accordance with other aspects of the invention, the number of lost data items which are recoverable, expressed as a fraction, is designated α and is determined by finding a ρ value satisfying the inequality $\rho(1-\alpha\lambda(1-x))>x$ for all $x\in[0,1]$. It will be recognized that in practice the number of lost redundant data items will also correspond to α. The value of λ corresponds to the first distribution and the value of ρ corresponds to the second distribution. The computation of ρ is performed using a standard binary search for a using linear programming to determine if there is a ρ corresponding to α for a fixed λ. The computation of ρ can be limited to a selected range of different numbers of second edges or to a selected number of different numbers of second edges, if it desired to reduce the processing overhead. If desired, ρ could initially be roughly computed using a first number of x values, and then refined by recomputation using a greater number of more closely spaced x values.

The maximum number of first edges can be changed causing each data item to be associated with one of the different numbers of first edges which are within a new range bounded by the changed maximum. These modified numbers of first edge are associated with the data items according to a third distribution, which is different than the first distribution. Each redundant data item is associated with a one of the different numbers of second edges which are based on the change in the maximum number of first edges. These modified numbers of second edges are associated with the redundant data items according to a fourth distribution, which is different than the second distribution.

A maximum and minimum number of second edges to be associated with redundant data items is also identified. Beneficially, the minimum number of second edges is 1. These maximum and minimum numbers are also different positive integer values. A second distribution of different numbers of second edges, ranging from the maximum to the minimum, to be associated with the redundant data items is computed. A number of second edges, within the range, is established for each redundant data item. The different numbers of second edges are associated with the redundant data items according to the second distribution. This second distribution may, for example be a Poisson distribution. The second distribution is determined such that a maximum number of data items are recoverable.

A determination is made of the number of the data items which are recoverable if lost or correctable if corrupted, in an encoded message formed of the data items and redundant data items, with each of the redundant data items corresponding to a number of the data items equal to the associated number of second edges. More particularly, the redundant data items are formed such that each of the redundant data items represents those of the data items to which it is connected by first and second edges. For example, each redundant data item may be formed to equal an exclusive-or of the those data items to which the redundant data item is connected by edges.

A threshold number of potential lost or corrupted data items is established. This will typically be the likely maximum number of data items requiring replacement or correction in the particular implementation. An encoded message is formed, with the redundant data items associated with the data items according to the first distribution and the data items associated with the redundant data items according to the second distribution, only if the number of data items which are determined to be recoverable or correctable exceeds the threshold.

A determination is made as to whether or not the number of data items which are recoverable or correctable from an encoded message formed with each of the redundant data items corresponding to a number of the data items equal to one of the modified numbers of second edges, exceeds the threshold. If so, an encoded message with the redundant data items associated with the data items according to the third distribution and data items associated with the redundant data items according to the fourth distribution is formed.

In accordance with other aspects of the invention, the associated number of first edges for each data item is established by random assignment of each of the different numbers of first edges so as to provide the appropriate distribution of the different numbers of first edges. The associated number of second edges for each redundant data item is also established by random assignment of each of the different numbers of second edges so as to provide the appropriate, e.g. Poisson, distribution of the different numbers of second edges. Preferably, each second edge is also randomly connected to a one or more of the first edges so as to provide the applicable distributions of first and second edges.

BEST MODE FOR CARRYING OUT THE INVENTION

Figure 1:
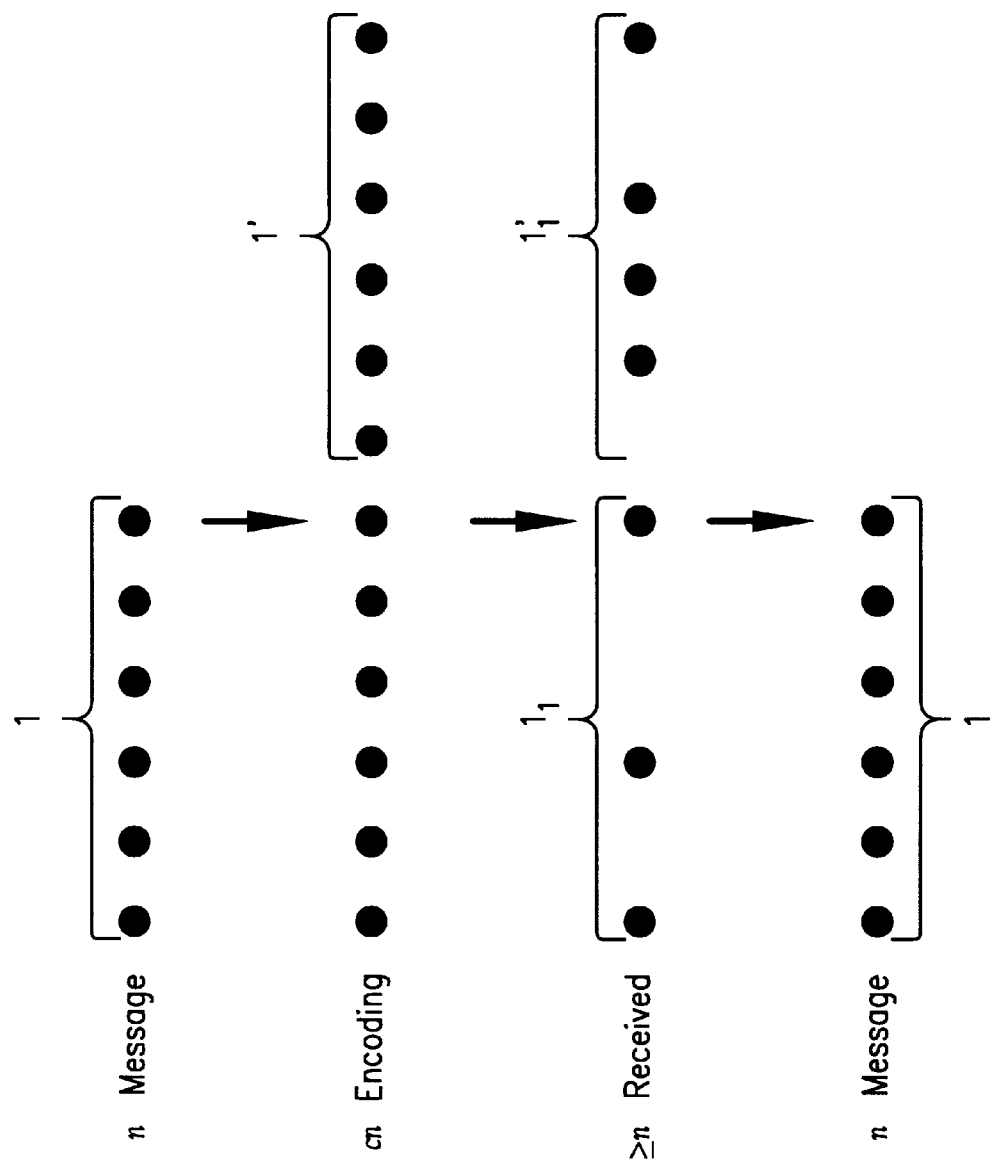
FIG. 1 is a simplified depiction of the steps performed in encoding and decoding a message.

FIG. 1 provides a simplified depiction of the process of encoding and decoding messages for loss resilience. As shown, a message 1 having n data items is encoded by an encoding algorithm prior to transmission. The encoding algorithm creates redundant data items 1' which are combined with the original data items 1 to form an encoded message having a length cn. The number 1/c is commonly referred to as the rate of the encoding technique. As shown, the original information contains six data items 1, to which six redundant data items 1' are attached to form a codeword. Accordingly, the stretch value c is 2 in the example shown. The corrupted version of the codeword which is received after transmission contains only three of the original data items which are designated $1_1$ and four of the redundant data items designated $1'_1$. The properly received redundant data items $1'_1$ are utilized to recreate the full original message having data items 1, using the decoding algorithm.

Figure 2:
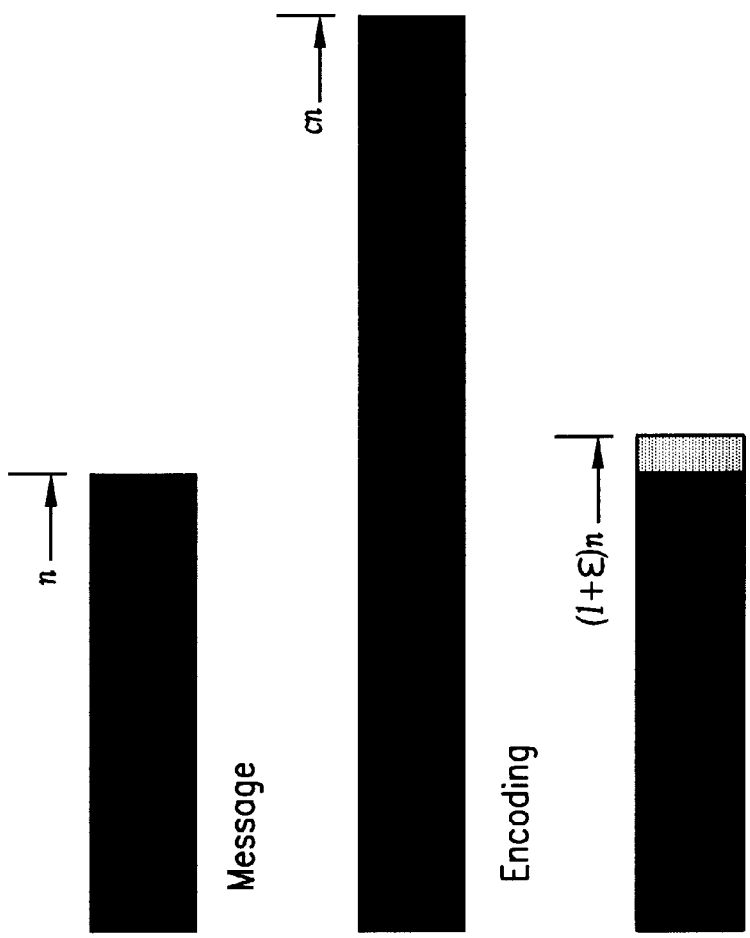
FIG. 2 depicts parameters of encoding and decoding.

FIG. 2 depicts the parameters of the technique. As shown, the message has a length of n data items. With the redundant data items added, the encoded message has a length cn. The decoding overhead can be represented by a value $\epsilon$. As indicated by the lower bar in FIG. 2, the number of data items and redundant data items required to decode the received encoded message can be described by the equation $(1+\epsilon)n$.

Figure 3:
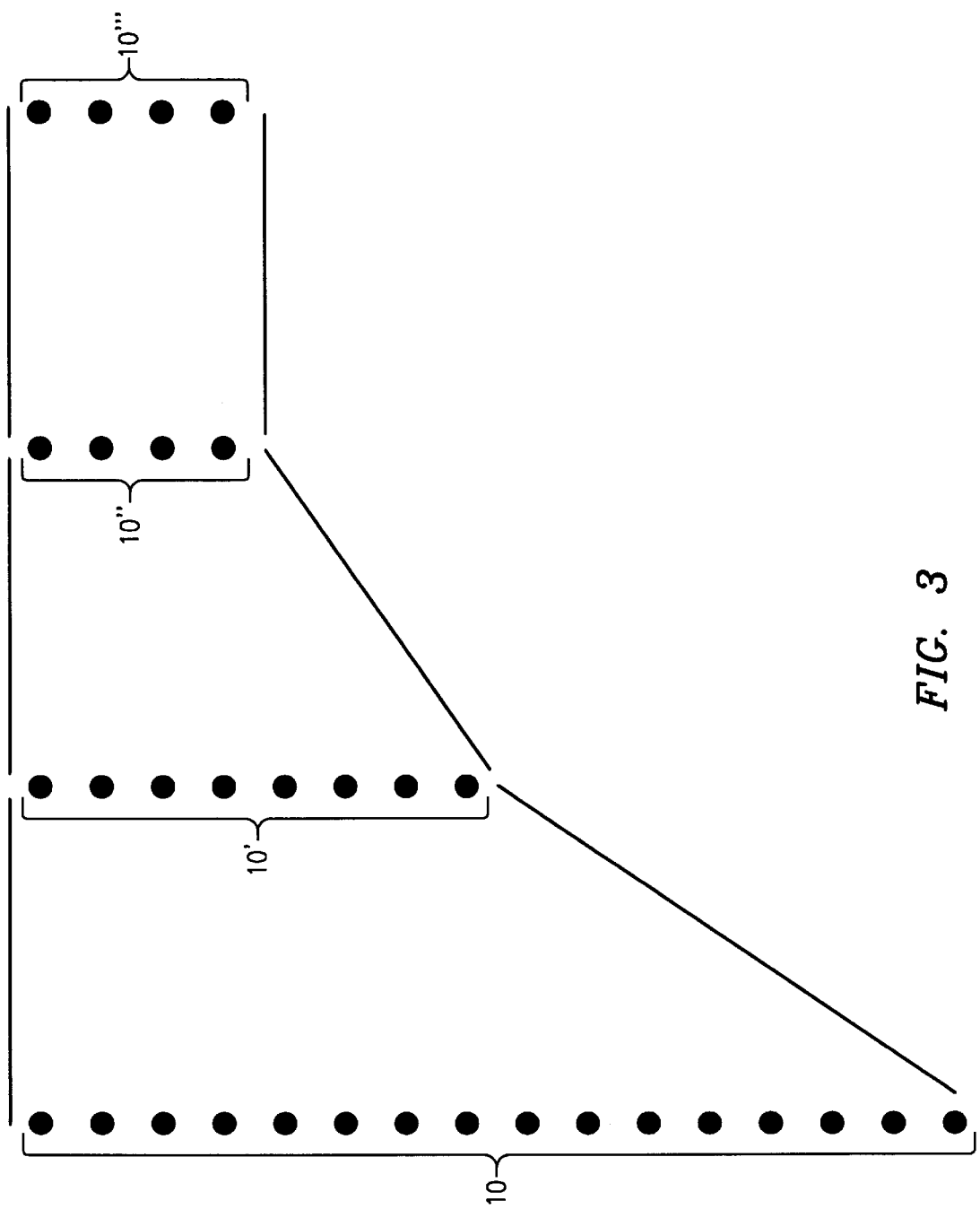
FIG. 3 depicts a cascading encoding structure in accordance with the present invention.

FIG. 3 depicts a cascading series loss resilient encoding structure in accordance with the present invention. As depicted, a message 10 includes data items associated with nodes 1–n. Redundant data items are associated with nodes formed in cascading levels or layers of nodes 10', 10" and 10'''. Assuming that the message is stretched to a length cn, then the factor $\beta=1-(1/c)$ and the number nodes at 10' is $\beta n$ and at 10" is $\beta^2 n$. At the last layer, the number of nodes is cn less the number of nodes at all other layers. Each pair of adjacent levels of nodes forms a bipartite graph. Each of the data items and redundant data items associated with each layer of nodes 10, 10', 10" and 10''' includes an address with which the information contained therein is further associated. Each of the redundant data items associated with the respective cascading layers of nodes 10', 10" and 10''' includes an amount of information identical to that contained in the corresponding data items associated with a node or nodes in layer 10. However, the information in each of the redundant data items associated with the node layers 10', 10" and 10''' is, as will be described in detail below, different from that in the data items associated with the corresponding node(s) in the node layer 10.

The number of redundant data items in the node layers 10', 10" and 10''' will depend on the desired length of the codeword, which in turn depends upon the expected number of losses in the data items and redundant data items during transmission. Preferably, the cascading of the redundant nodes is restrained to a limited number of levels, most preferably 3, in order to minimize both the time overhead and decoding overhead while maintaining high reliability.

A typical decoding overhead, in accordance with the present invention, for a rate ½ code, is approximately 0.03. This small increase over the decoding overhead of conventional techniques is offset by a time overhead which is substantially less than that required to encode and to replace lost data items using conventional techniques.

More particularly, the time overhead required to encode and decode, expressed as a multiple of the total number of data items and redundant data items, is approximately ln(3/

ε), ε being the decoding overhead. Accordingly, for a decoding overhead of 0.03, the resulting time overhead is 4.5. This compares with a time overhead which will typically be well in excess of 1,000 using conventional techniques.

Inherently, it will be a random portion of a codeword which is received at the receiving end of a transmission. That is, whatever amount of the codeword is received is determined by which data items and redundant data are lost. The portion of the data items and redundant data items that are received will, in fact, be a portion that is independent of the contents of those items. Preferably, the data items and redundant data items are sent in a randomly interleaved order. The decoding depends upon receiving approximately the same fraction of those items from each layer. Because of the random ordering of those items, a random portion of those items will be received. This randomness ensures the necessary random portion of the codeword is received notwithstanding the arbitrariness of the data item and redundant data item contents. Thus, data items and redundant data items are randomized so that there is a high probability of proper decoding and decoding overheads are minimized. It will be understood that, as used herein, the term "random" should be construed to include pseudo randomness, biased randomness and other types of randomness.

Referring again to FIG. 3, if the encoding structure is to be stretched, for example, by a factor of 2, then the total number of redundant data items associated with the node layers $10'$, $10''$ and $10'''$ will equal the number of data items in the node layer $10$, i.e., n. In general, the number of redundant data items and, hence, nodes at each cascading level is reduced by a constant factor β such that the total number of data items and redundant data items will equal the total number of data items n multiplied by the stretch factor c. Accordingly, β=1−1/c, with c being the stretch factor, in this example, 2.

In FIG. 3, the total number of data items associated with the node layer $10$ is 16, i.e., n, equals 16, and the stretch factor, i.e., c, equals 2. The number of redundant data items at each consecutive level of the cascading series is reduced or shrunk by a factor of 2. Hence, the number of redundant data items in series $10'$ is 8 (i.e., 0.5×16). The number of redundant data items in series $10''$ is 4 (i.e., 0.25×16). The number of redundant data items in the series $10'''$ could be 2 (i.e., 0.125×16); however, to limit the time and decoding overhead, all nodes which would have existed in subsequent redundant layers are aggregated in a last layer, i.e., $10'''$, and a different graph structure, which will be described further below, is utilized. The encoding structure would, in a theoretical cascading series, continue to extend on until the total number of redundant data items equals 16.

Figure 4:
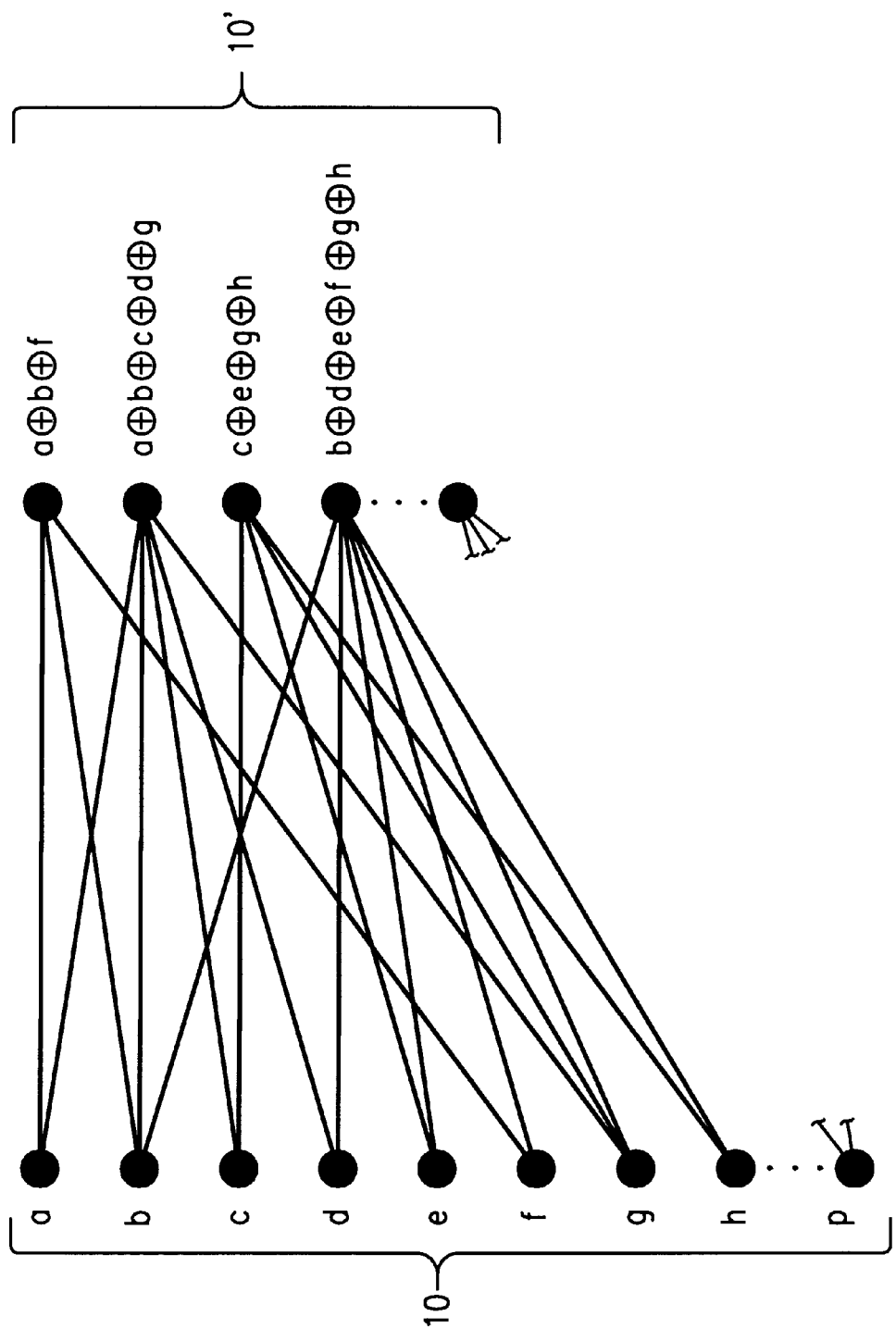
FIG. 4 depicts a graph of a partial set of irregularly graphed edges between node layers of the FIG. 3 encoding in accordance with the present invention.

FIG. 4 depicts a graph of a partial set of edges irregularly graphed from the layer $10$ to the first redundant layer $10'$. The lines connecting the respective nodes in layer $10$ with nodes in layer $10'$ dictate how the redundant data items at nodes $10'$ are computed based upon the information in the data items associated with layer $10$. In the example shown, if the respective data items at layer $10$ nodes have values a–p as indicated and are graphed to the nodes at layer $10'$ as shown in FIG. 4, then the values of the redundant data items associated with the top four nodes in layer $10'$ will be computed as shown using an exclusive-or operator. For example, the top or first node will have an associated value representing a exclusive-or b exclusive-or f.

As will be recognized by those skilled in the art, computing systems typically include an exclusive-or function as a standard operation which performs a sum of bits mod2 on a bit by bit basis. It will further be recognized that conventional computing systems are typically capable of performing an exclusive-or operation on each bit within a word in parallel, i.e., in one operation. Accordingly, the exclusive-or operation adds relatively little overhead to the encoding processing. Hence, if the information within each of the data items at the message nodes $10$ consists of several words, as is customary, then an exclusive-or would be taken of each word in data item a with the corresponding words of data item b and an exclusive-or of the corresponding words of data item f. This will result in a value at the associated node $10'$ of the same length as the information in data items a or b or f and the value will equal the value of a exclusive-or b exclusive-or f.

Each of the data items and redundant data items at nodes $10$, $10'$, $10''$ and $10'''$ includes an associated index which is received with the item. The index corresponds to the information within the item. Accordingly, a recipient is able to determine that a received redundant data item associated with the top node of layer $10'$ includes a x-or b x-or f. More particularly, the index identifies the node with which the item is associated.

It should also be noted that the number of edges at the layer $10$ nodes far exceeds the number of edges at the layer $10'$ nodes. The time for computing the values of each of the redundant data items at nodes $10'$ is a function of the number of edges at each node $10'$. The same relationship will hold true at nodes $10''$ and $10'''$. Accordingly, it is beneficial to limit the number of edges at each of the nodes.

Figure 5:
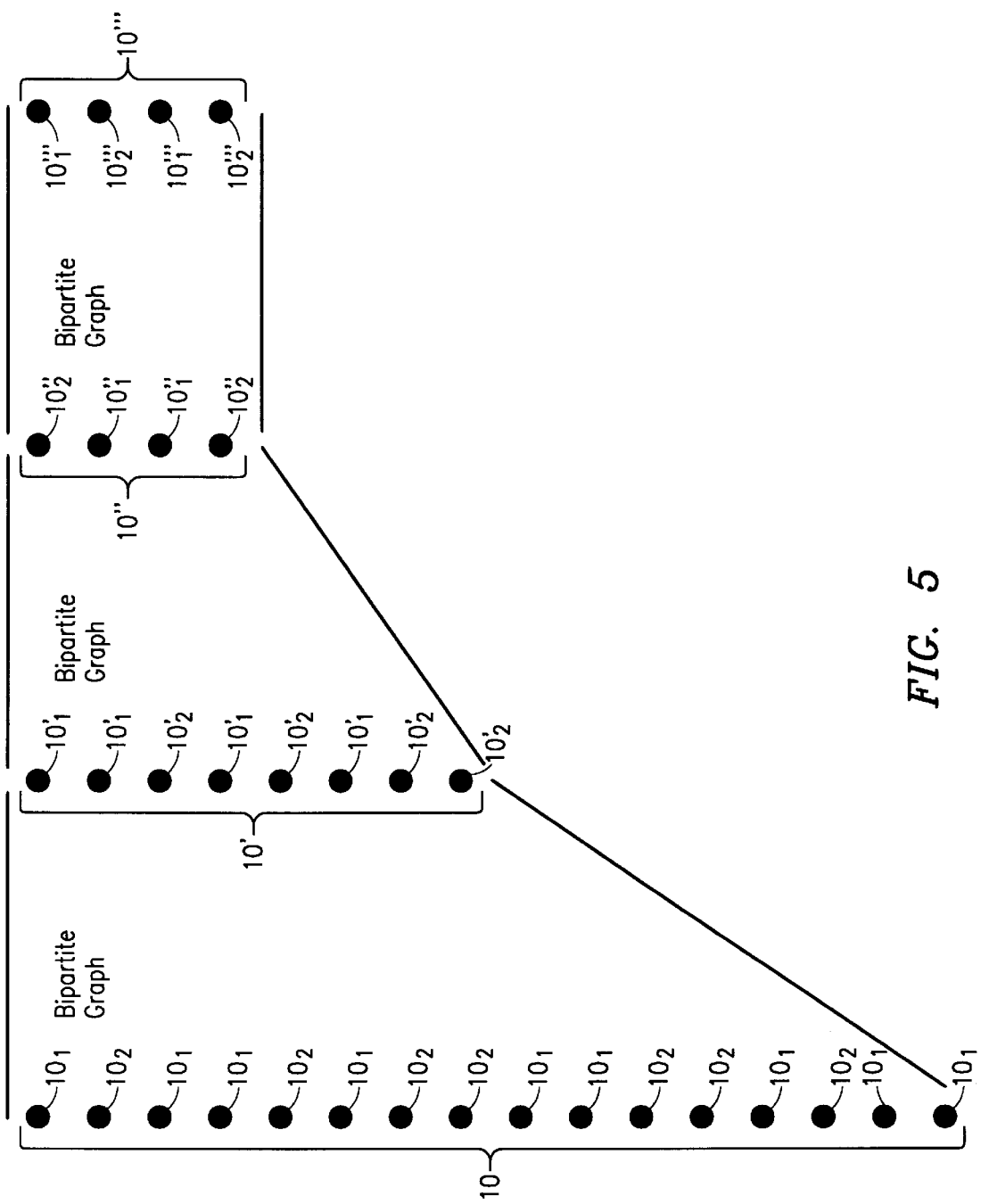
FIG. 5 depicts a received corrupted version of a codeword in accordance with the present invention.

FIG. 5 depicts the corrupted version of the codeword at the time of receipt. As shown, the information in the data items designated $10_1$ has been received and the information in the data items designated $10_2$ has been lost and accordingly, are missing from the received transmission. At the layer $10'$ the information in redundant data items $10_1'$ has been received. However, the information in the redundant data items $10_2'$ has likewise been lost in the transmission and is unavailable at the receiving end of the communication.

Similarly, at layer $10''$, the information in the redundant data items associated with nodes designated $10_1''$ has been received and the information in the redundant data items associated with the nodes $10_2''$ has been lost. At layer $10'''$, the information in the redundant data items associated with nodes designated as $10_1'''$ has been received and information in the redundant data items associated with nodes $10_2'''$ was lost during the transmission and, accordingly, are missing from the received encoded message.

Decoding is performed by first decoding the redundant data items, associated with layer $10''$ using the information in the received redundant data items associated with the nodes at layer $10'''$. The information contained in the redundant data items associated with the layer $10'$ nodes are then decoded using the information in the decoded redundant data items associated with nodes at layer $10''$. The information or values in the decoded redundant data items associated with layer $10'$ are then used to decode data items associated with layer $10$, which contain the information of the message.

Figure 6:
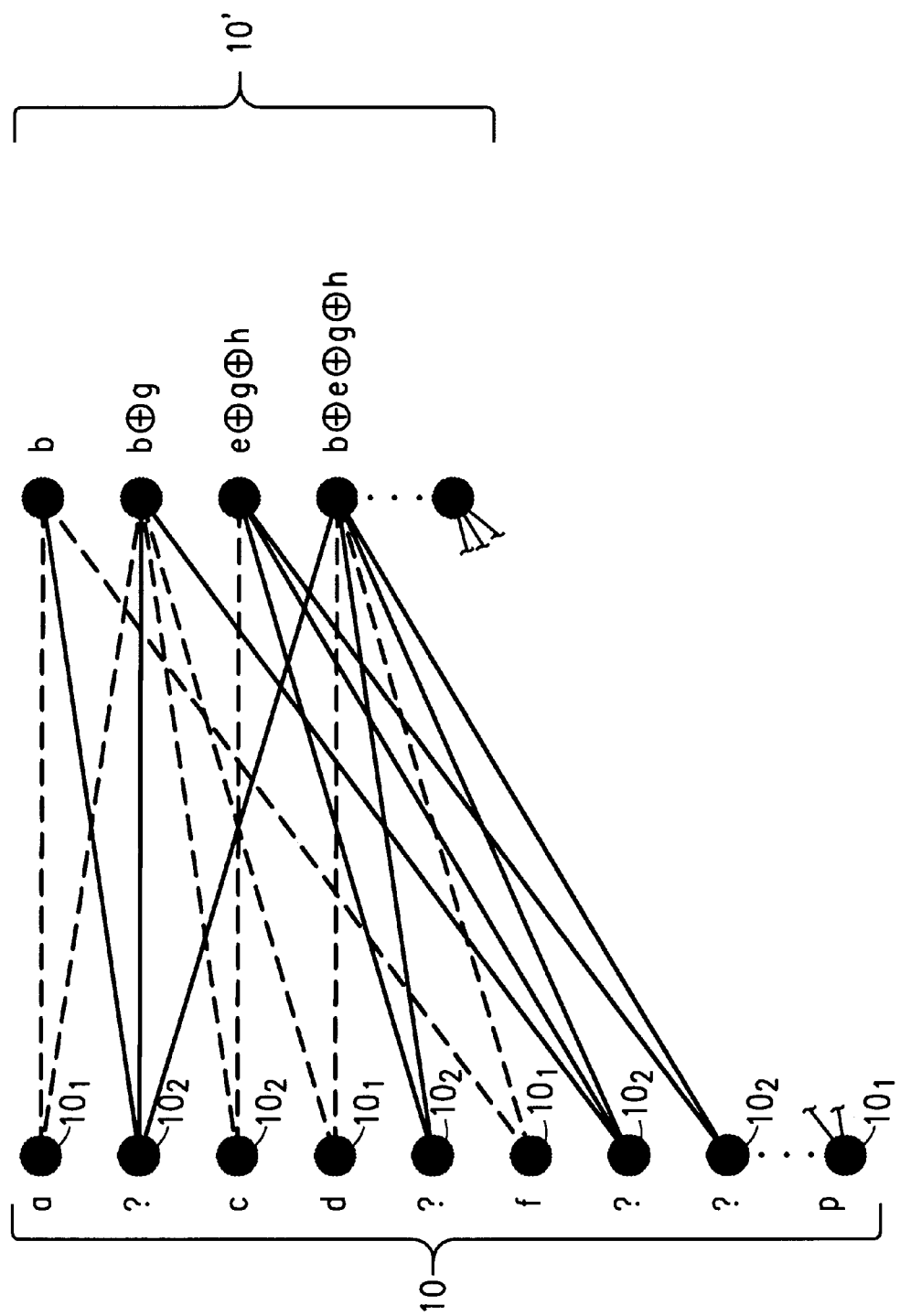
FIG. 6 is a partial depiction of the edges between nodes of the FIG. 3 encoding at the receiving end of a transmission.

FIG. 6 depicts the edges from the nodes in layer $10$ and the edges of related nodes in layer $10'$, after the missing redundant data items associated with layer $10'$ have been recovered using information from redundant data items associated with layer $10''$. The values indicated at the right of the nodes in layer $10'$ are those computed by performing an exclusive-or of the value of each redundant data item associated with the nodes 10' with the available received information from the data items associated with nodes 10. This operation allows the unknowns at layer 10 to be reduced.

More particularly, the value associated with the uppermost node in layer 10', as shown in FIG. 4, corresponds to a x-or b x-or f. The values of a and f are known from the received data items associated with layer 10. Hence, the information in the redundant data item associated with the uppermost node at layer 10' can be combined with the values a and f which have been received in the data items associated with layer 10, to recover the value b. Once the value b has been recovered, an analogous operation can be performed upon the second to top node in layer 10' to recover the value b x-or g, and so on. Accordingly, the influence of received information associated with the respective nodes at layer 10 on the redundant data items associated with layer 10' can be reduced. Although this operation is discussed herein only with regard to levels 10 and 10', it should be understood that the same operation is performed at each level of decoding.

As a result of this operation, the values of the redundant data items associated with the nodes at layer 10' are modified as shown.

Once this reduction in the influence of the received information in the data items of layer 10 on the redundant data items associated with the nodes of layer 10' has been performed, the remaining unknowns, i.e., the information of the original data items which are yet to be decoded, could be computed using an inversion operation as is conventional. However, such a computation requires significant processing. The time to perform this processing for some number K nodes on the right, e.g., at layer 10', is on the order of $K^2$ to $K^3$.

Figure 7:
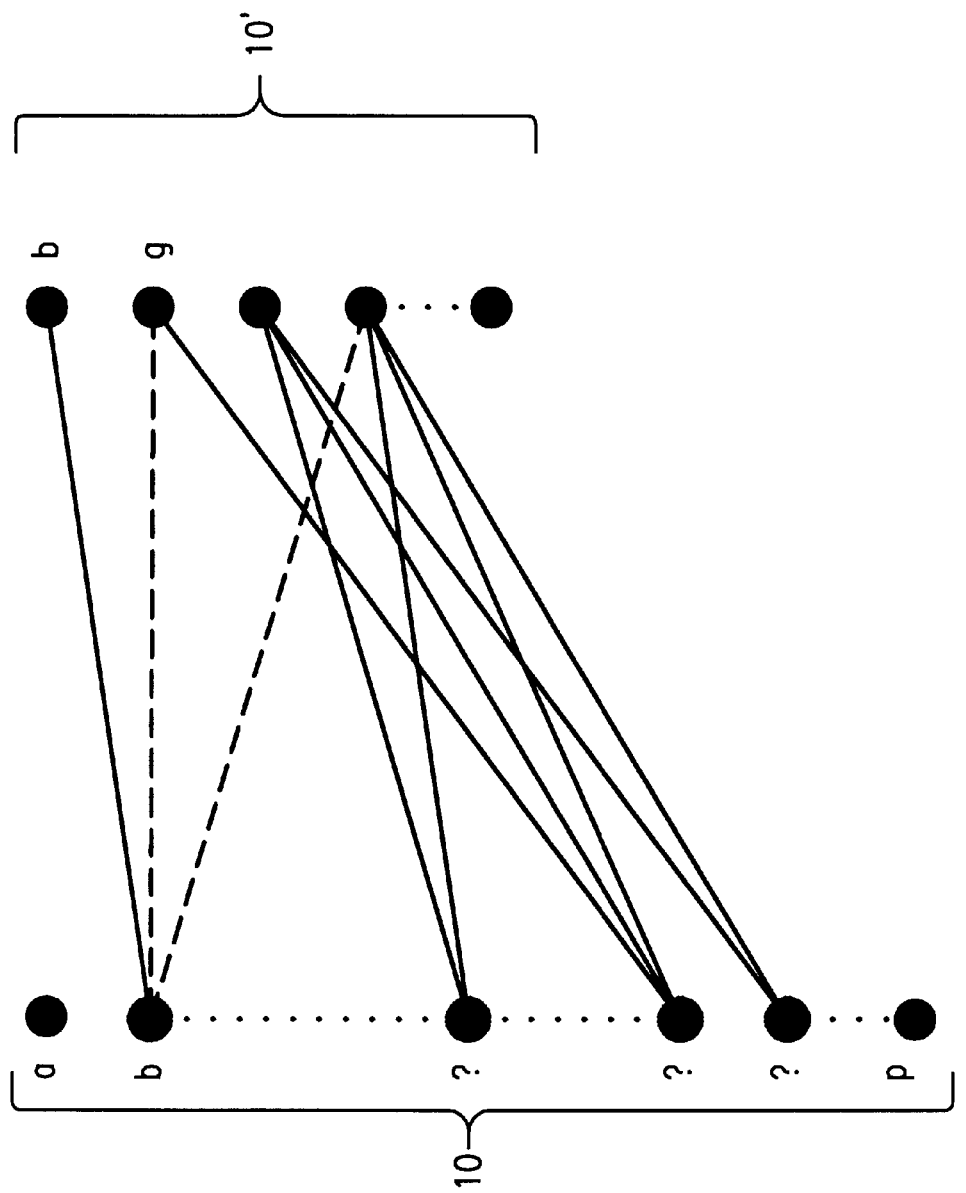
FIG. 7 depicts the decoding process in accordance with the present invention.

In lieu of such an operation, each redundant data item associated with layer 10' which includes only a single value, e.g., b, is copied to recover a missing data item associated with the applicable node at the layer 10, i.e., the second node. As shown in FIG. 7, the redundant data item associated with the second node at layer 10' has been reduced to the value g by using the recovered value b at layer 10. This value can be copied to recover the data item associated with the seventh node at the layer 10. To fully decode the original message in this manner requires that there always be at least one redundant data item associated with a node at layer 10' which has a single value. Stated another way, the edges at most of the nodes 10' must be reduced to 1 and the remaining value associated with the node utilized to recover missing information in the received data items associated with layer 10. Any graph providing this result is considered a sparse graph. More broadly, any graph in which the total number of edges is a small fraction of the total number of edges that could possibly appear between the nodes of the graph is considered a sparse graph. For example, a graph in which the total number of edges is at most 10% of the total number of edges that could possibly appear is sparse graph. As the success of decoding requires that the edges at most of the nodes 10' be reduced to 1, the graph between layers 10 and 10' must be sparse, for otherwise it is highly unlikely that this reduction will occur. The process continues until full recovery of the data items associated with the layer 10 nodes has been achieved.

Figure 8:
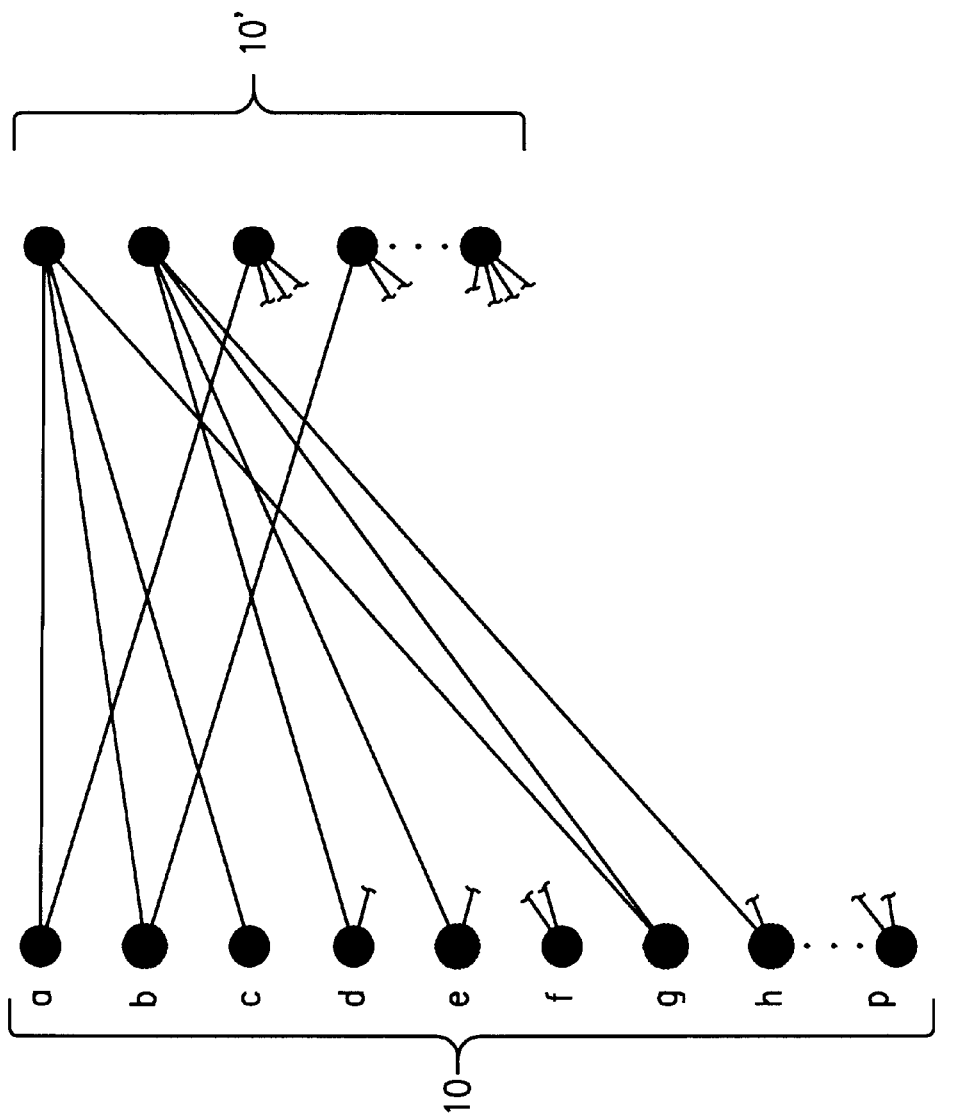
FIG. 8 is similar to FIG. 4, but reflects regular rather than irregular graphing of edges between nodes.

FIG. 8 depicts layers 10 and 10' of the encoding structure of FIG. 3. However, unlike the irregular graphing depicted in FIG. 4 in which the number of edges at the respective nodes of layer 10 varied between 2 and 3 edges per node and the edges at the respective nodes of layer 10' varied between 3 and 5, in FIG. 8 a regular graphing of nodes is shown. More particularly, each of the nodes in layer 10 has exactly 2 edges and each of the nodes in layer 10' has exactly 4 edges. With the edges graphed as shown in both FIGS. 4 and 8, the mapping of the edges is random so each edge at the nodes of layer 10 are equally likely to be mapped to any of the nodes in layer 10'.

Figure 9:
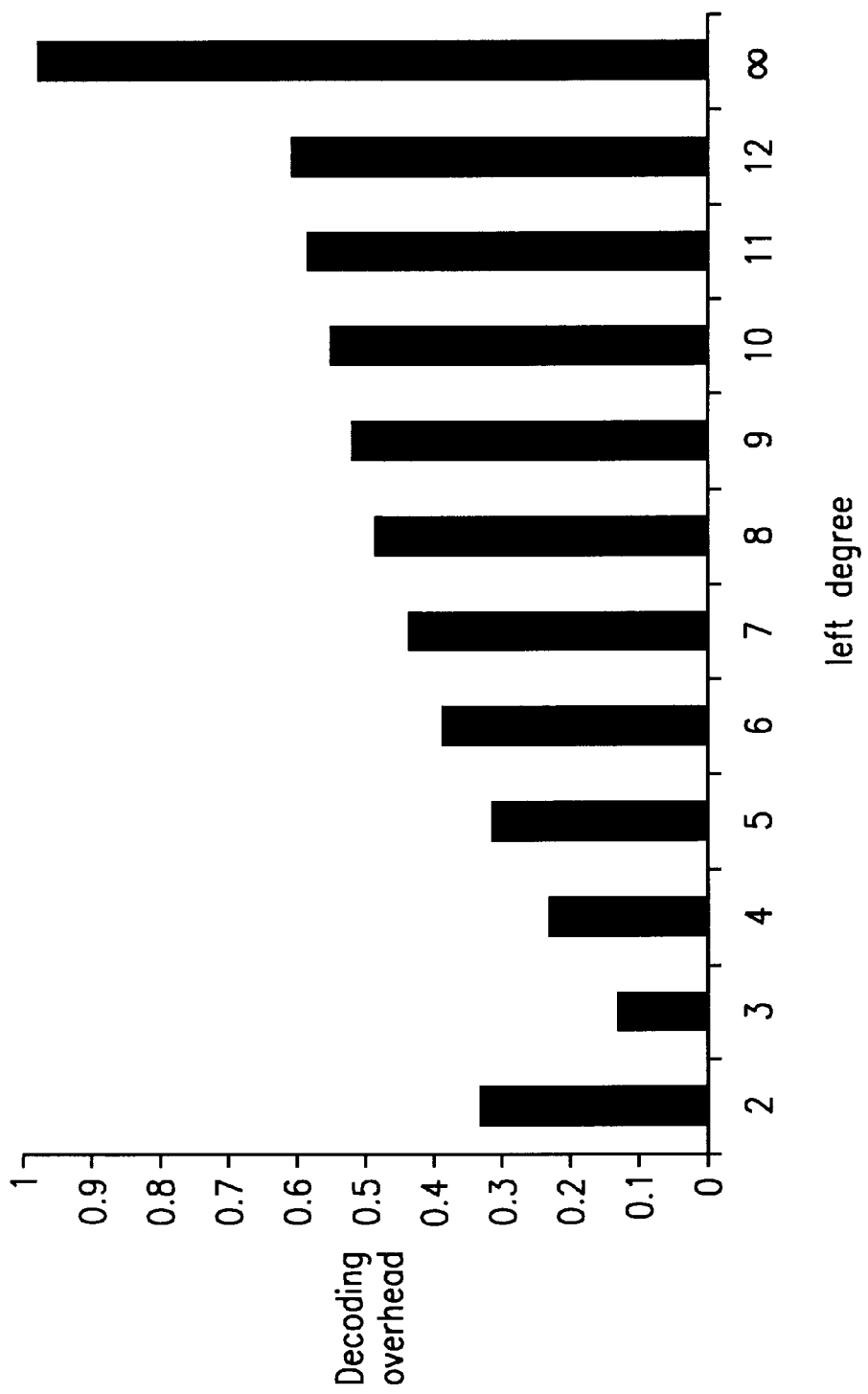
FIG. 9 is a graph of the decoding overhead with the left nodes having regularly graphed degrees.

FIG. 9 graphs the decoding overhead resulting from the use of different left edges or degrees, e.g., the number of edges at each node in layer 10, in a regular graphing of edges as shown in FIG. 8. As can be seen using three degrees at each node in layer 10 provides the lowest decoding overhead. Accordingly, using a cascading encoding structure of the type shown in FIG. 3 with the number of nodes decreased by one-half for each redundant layer, the least decoding overhead will result if 3 edges are mapped from each node in layer 10 to 6 edges at each node of layer 10'.

By utilizing 3 edges at each of the nodes at layer 10, the decoding overhead will be approximately 14% as indicated in FIG. 9. Thus, the cascading series of redundant data items as depicted in the encoding structure of FIG. 3, with regular graphing between the nodes at the respective layers as shown in FIG. 8, results in the decoding overhead being increased only a relatively small percentage over that of the Fourier transform-based loss resilient encoding techniques. Even better results are obtainable by graphing the edges of the nodes at each level irregularly, as shown in FIG. 4, as will be discussed further below. By carefully determining the degree sequencing, the decoding overhead can be optimized.

A good irregular degree sequence design can be established by setting the maximum left degree, e.g., the maximum number of edges at any node in layer 10, at a design parameter D+1, with D being a positive integer less than the number of data items. The average left degree is constrained to equal ln(D). Accordingly, although the maximum left degree may be large, the average left degree will remain relatively small.

For example, if the design parameter is 100 at layer 10, the maximum number of edges from any node in layer 10 is constrained at 101. However, the average left degree of any node at layer 10 will be approximately 4.5. In balancing the time overhead and decoding overhead, the time overhead will be proportional to the average degree while the decoding overhead will be proportional to a normalizing constant 1/D. This corresponds to a $\epsilon=1/D$ decoding overhead which makes the maximum degree D+1 approximately equal to $1/\epsilon$ at the left whereas the average degree at the left is approximately $\ln(1/\epsilon)$.

D is selected to provide, for example, a desired decoding overhead. Having selected the design parameter D and computed the maximum left degree as described above, the fraction of the nodes of left degree i is defined by the equation:

$$f=N/[i(i-1)], \tag{1}$$

where N=1+1/D.

For example, the fraction of nodes of left degree 2, with the maximum left degrees being 10, will equal approximately 55%.

Figure 10:
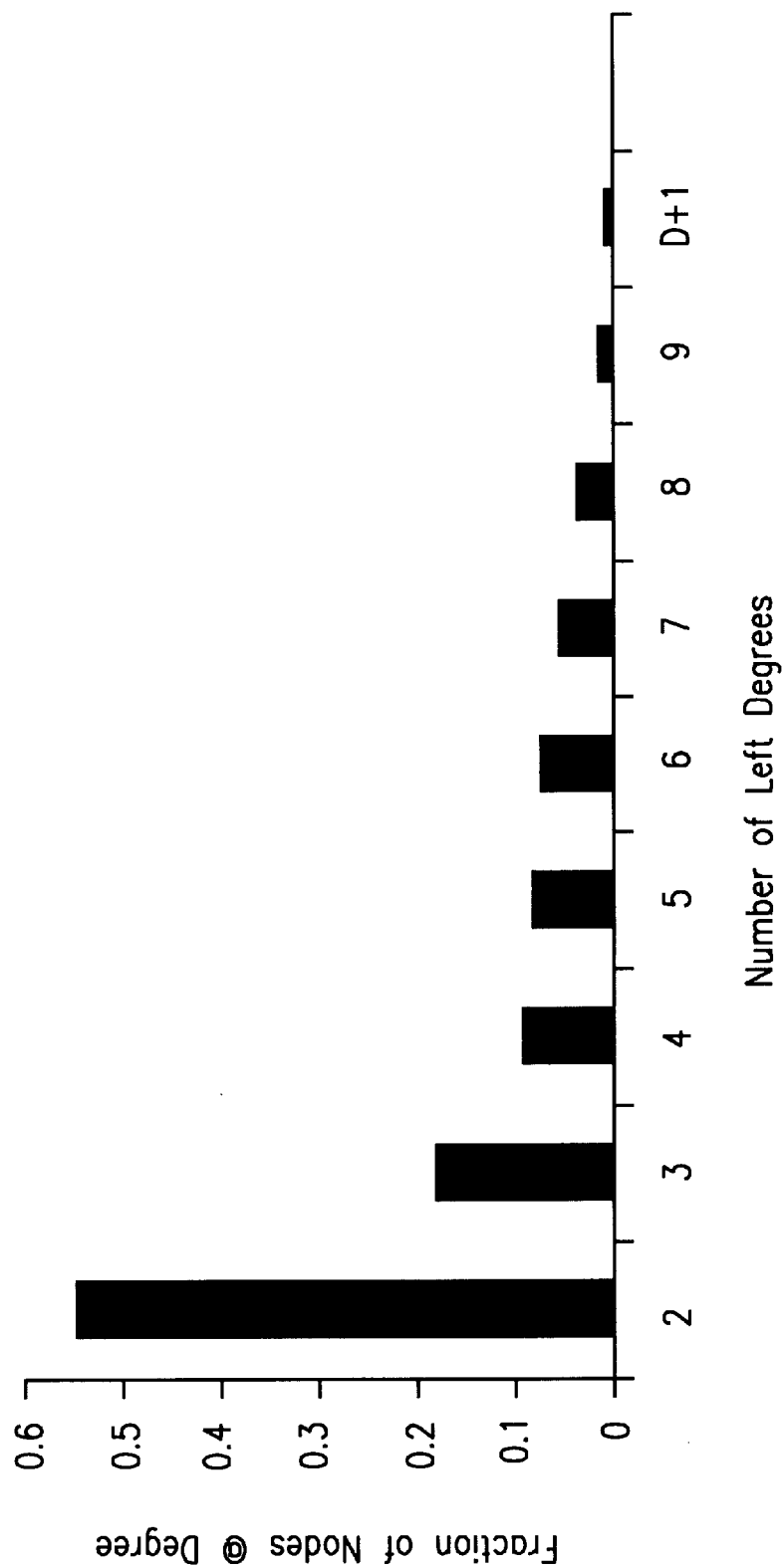
FIG. 10 graphs the fractional portions of nodes at different degrees in a good left degree sequence having a cascading series with a truncated heavy tail in accordance with the present invention.

FIG. 10 graphs the fraction of nodes at degrees 2–10 based upon a selected design parameter of 9. Here the normalizing constant N is approximately 1.111. As will be recognized, the larger the design parameter D, the closer the normalizing constant N comes to essentially equaling 1. Using equation (1), the fraction of nodes has been determined for each degree from the minimum number degree, i.e., 2, up to the maximum number degree, i.e., 10. FIG. 10 shows the fraction of nodes of each degree in layer 10 of FIG. 3 with the design parameter D set to 9.

Figure 11:
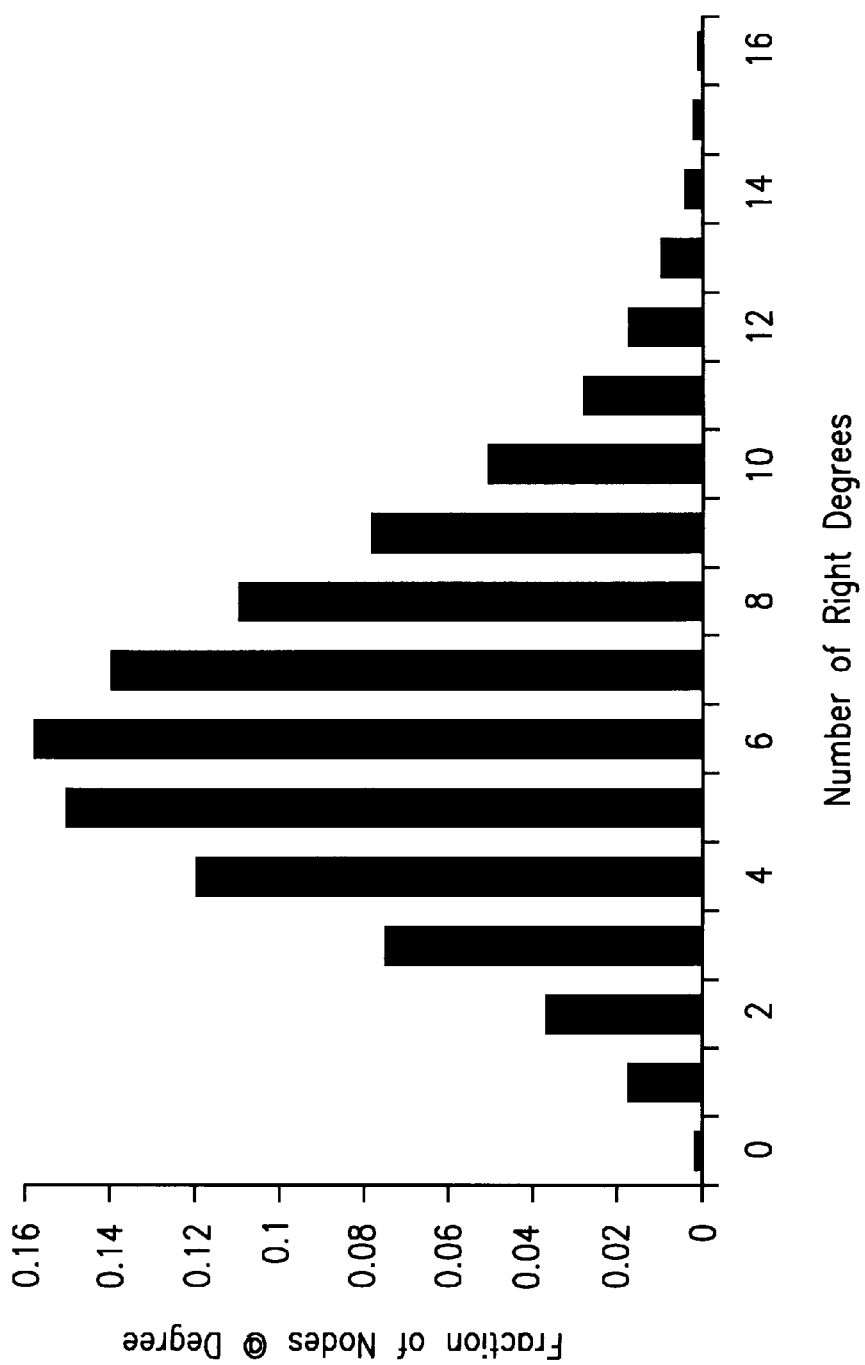
FIG. 11 depicts a distribution of right node edges for the left edge distribution depicted in FIG. 10 in accordance with the present invention.

FIG. 11 depicts the Poisson distribution of edges randomly distributed at layer 10'. That is, each of the edges at the layer 10 nodes is randomly connected to an edge at a layer 10' node in accordance with the FIG. 11 distribution. Beneficially, some nodes at layer 10 have a much higher degree than the average degree. Edges from these high degree nodes at layer 10 are preferably connected to some nodes at layer 10' having only one degree or edge; since this will aid in decoding the data items associated with the layer 10 nodes.

The average degree of the layer 10' nodes is $1/\beta$ times the average degree of the layer 10 nodes and accordingly is approximately equal to $\ln(D)/\beta$. Accordingly, if there is a high probability that high degree nodes at layer 10 will be connected to single degree nodes at layer 10', and this condition remains true as the decoding process proceeds as described earlier, then all the transmitted data items associated with the layer 10 nodes can be decoded.

Figure 12:
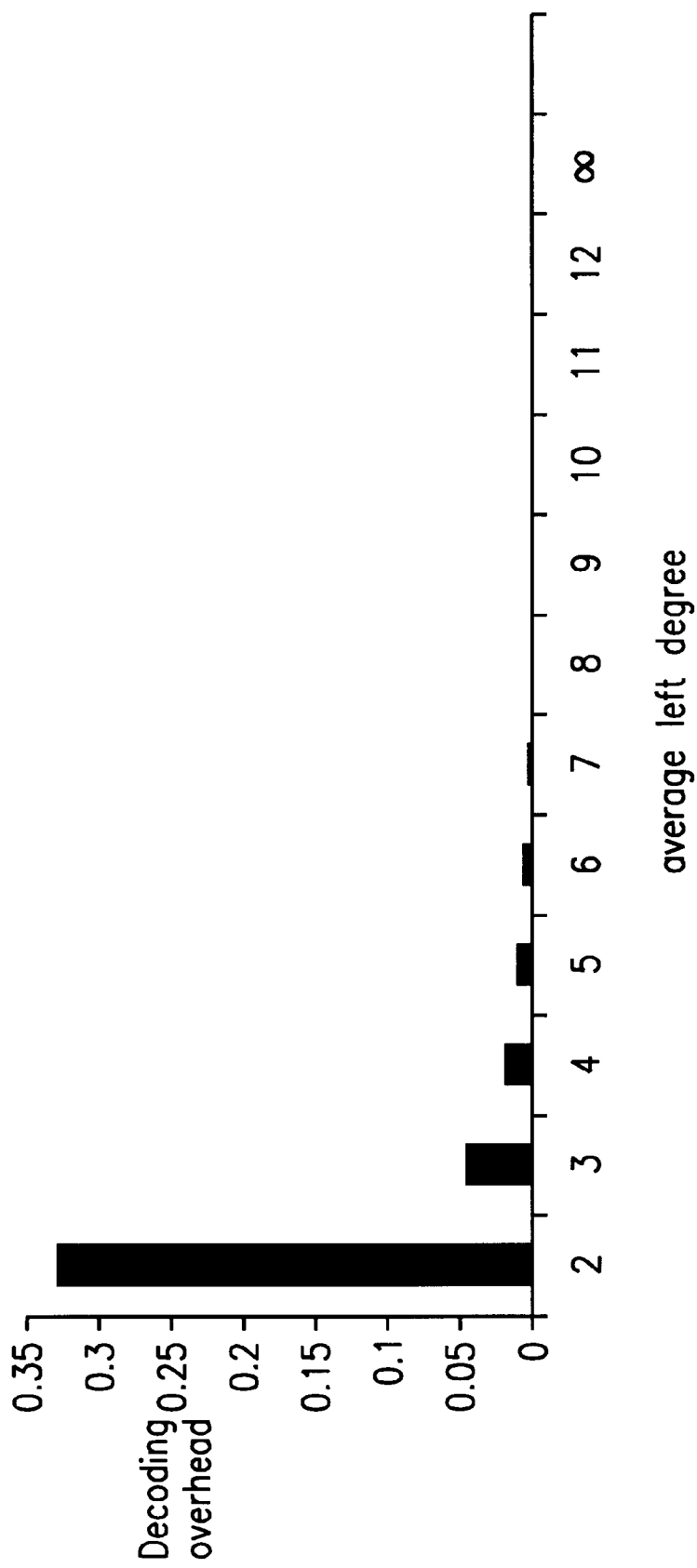
FIG. 12 is a graph of the decoding overhead with the left nodes having irregularly graphed degrees.

FIG. 12 graphs the decoding overhead against the average left degree at layer 10 nodes when the edges at layer 10 are irregularly graphed, as shown in FIG. 4, according to the distribution of FIG. 10 for nodes 10 and FIG. 11 for nodes at layer 10'. The FIG. 12 performance with irregularly graphed edges can be compared to the performance with regularly graphed edges indicated in FIG. 9. As shown in FIG. 12, the decoding overhead is significantly reduced as compared with the decoding overhead for regularly graphed edges if the average left degree is 3 or more.

It should be noted that, as shown in FIG. 9, for regularly graphed edges, as the average left degree increases, the decoding overhead increases. Using the just described irregular graphing of the edges, as the average left degree increases, the decoding overhead decreases. This decrease in the decoding overhead goes down exponentially for each degree increase. As indicated, at an average left degree in the range of 5 or 6, the theoretical decoding overhead $\epsilon$ is reduced to one percent or less.

Irregular graphing of the edges is particularly beneficial for large numbers of data items. Irregular graphing will be most advantageous in cases where the number of data items is in the tens of thousands or hundreds of thousands. For example, encoding based upon irregular graphing of the edges can be used very effectively in high bandwidth video transmissions or transmissions of large block(s) of data such as in downloading software or rebooting network servers.

Figure 13:
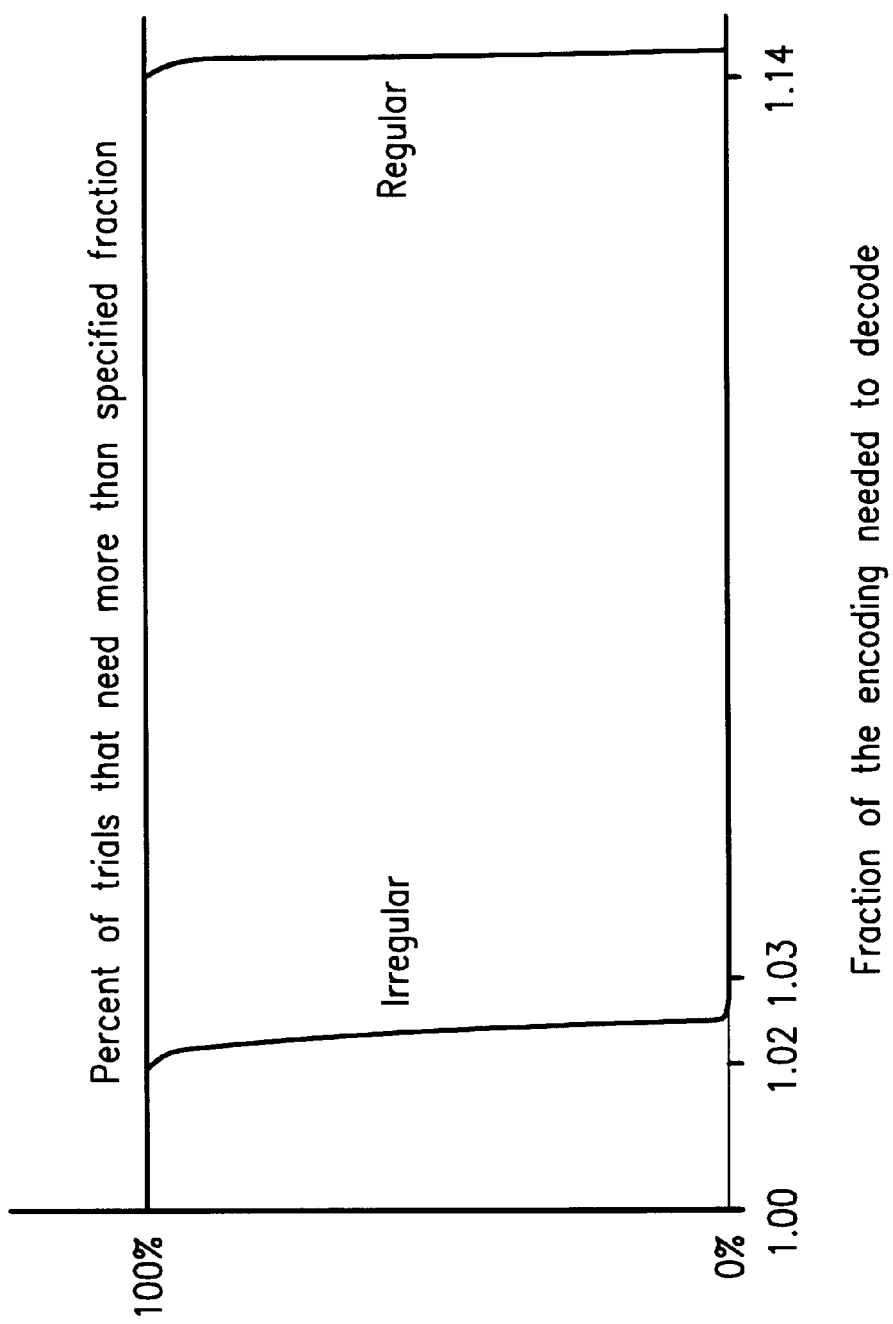
FIG. 13 is a graph of the fraction of data items and redundant data items that need to be received to decode a message using irregular and regular graphing of the edges between nodes in accordance with the present invention.

FIG. 13 is a graph of the number of data items and redundant data items expressed as a multiple of the number of data items required to decode the original data items. The graph represents trials on messages having 640,000 data items and 1,280,000 redundant data items. That is, the encoded message had an equal number of data items and redundant data items. At layer 10', 320,000 redundant data items were provided and at each of layers 10" and 10''', 160,000 redundant data items were provided. With irregular graphing of the edges, the required decoding overhead is approximately 2.3%. With regular graphing, over 14% decoding overhead is required. For the last layer, the number of right nodes is c−1 times the number of left nodes (as opposed to (c−1)/c in the previous layers). The values of right node degrees in the last layer are the same as those in previous layers, and the fraction of right nodes of each degree is the same as it is in previous layers. However, to compensate for the larger number of right nodes in proportion to the number of left nodes in the last layer, as compared to previous layers, the value of the left node degrees at the last layer are increased by a factor c over what they are at previous layers. Accordingly, the fraction of left nodes of degree c*1 within the last layer is the same as the fraction of left nodes of degree i in previous layers. Thus, in the example where c=2, if 20% of the left nodes at layer 10' have two edges, then 20% of the left nodes at layer 10''' will have four edges.

In practice, the nodes at each redundant layer may be just slightly increased over the number of nodes determined as described above. These few extra right nodes will have edges randomly connected to all of the nodes in an adjacent left layer. This small number, e.g., 100–300, of additional nodes, and hence redundant data items, will ensure that any lost data items which would otherwise remain undecoded, can be decoded utilizing the information in the additional redundant data items associated with the added nodes. If desired, the additional nodes could be edged to, for example, only nodes which are not high degree nodes; however, preferably, the additional nodes are each edged to all adjacent left nodes.

Rather than maintaining information regarding all of the edges which come into each node at a particular layer, preferably only the exclusive-or of all indices is maintained. Each time another data item or redundant data item is recovered at a higher level within the cascade, its index is x-or'd with the stored single index of all nodes. Accordingly, when only one node remains, the value of the joint indices will be the index of the remaining node. For example, for each right node a value is computed equaling the exclusive-or of all the indices of the left nodes to which it is connected by an edge. After data items or redundant data items have been received at all but one edge of the applicable layer, the joint index value will be the index value of the data item or redundant data item which has yet to be received.

Figure 14:
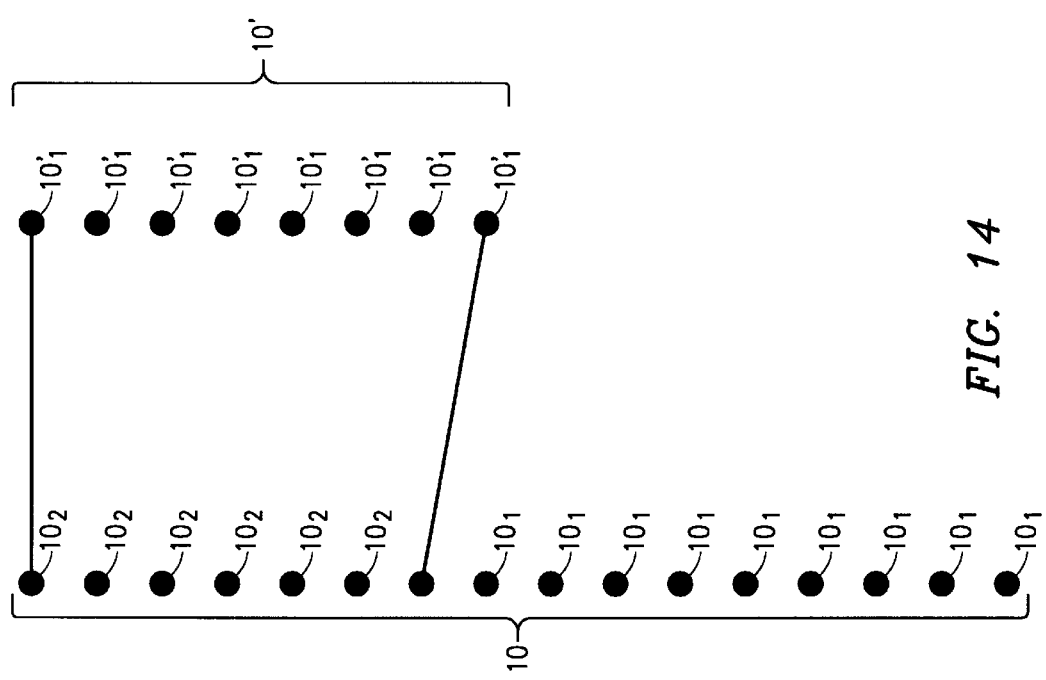
FIG. 14 depicts an induced graph of the received corrupted version of the codeword after all redundant data items at the right nodes have been recovered in accordance with the present invention.

FIG. 14 depicts the nodes of layers 10 and 10' of FIG. 3. The data items associated with the nodes marked $10_1$ of layer 1 have been received or subsequently recovered. The nodes designated $10_2$ have been lost and remain missing. All of the redundant data items associated with the layer 10' nodes have been received or recovered and are, accordingly, designated as $10'_1$. Although the following discussion will be in the context of layers 10 and 10', it should be understood that the same process can be applied in recovering redundant data items associated with nodes at layer 10' from redundant data items associated with nodes at layer 10" and the redundant data items associated with nodes at layer 10" using redundant data items associated with nodes at layer 10'''.

FIG. 14 shows the induced graph which results after data items associated with the nodes designated as $10_1$ have been received or recovered. As shown, the nodes designated $10_2$ remain graphed to the nodes of layer 10'. Hence, the graphing at this point to the nodes at layer 10 is induced by the remaining unrecovered nodes at layer 10.

In practice, the graphing of the layer 10 nodes to the layer 10' nodes will typically be described by the number of nodes of each possible degree. However, for clarity, the following discussion will be in terms of the fraction of edges of each degree on the left and right hand sides of the graph, i.e., at the layer 10 and layer 10' nodes of FIG. 14, the edge degree and node degree being equivalent.

The fraction of edges of degree i on the left in the original graph depicted in FIG. 4, e.g., the fraction of edges of degree i at layer 10, is designated $\lambda_i$. An edge has degree i on the left when its associated node on the left, e.g., its layer 10 node, has i edges coming from it. For example, referring to FIG. 4, each edge at the uppermost node of layer 10 has a degree i equal to 2. Each edge at the second node at layer 10 has a degree i equal to 3. Each edge at the uppermost or first node in layer 10', has a degree i equaling 3. Each edge at the second node in layer 10' has a degree i equal to 5. Thus, an edge may have different degrees at the left and right sides of the graph as indicated in FIG. 4.

The fraction of edges of degree i on the right side of the original graph, e.g., at layer 10' in FIG. 4, is designated $\rho_i$. Once $\lambda_i$ and the $\rho_i$ for all i's are known, the parameters of the graph are completely specified. Hence, this provides a complete description of the graph when taken together with knowledge of the number of nodes on the left and right. Once the graph has been so specified, the graphing of the left and right edges are made randomly. That is, the connections between the edges on the left, e.g. at layer 10, and at the right, e.g., at layer 10', are random.

Knowing the number of nodes on the left and $\lambda_i$ for each degree i, the left edges can be associated with the left nodes in the proper distribution. Knowing the number of nodes at layer 10' and $\rho_i$ for each degree i, the right edges can be associated with the layer 10' nodes in the proper distribution. The number of edges on the left, e.g., at layer 10, must equal the number of edges on the right, e.g., at layer 10', since the edges on the left and right must match up.

As previously discussed, FIG. 10 represents the distribution of the different node degrees at the left side of the graph, e.g., at layer 10 of FIG. 4, and FIG. 11 graphs the distribution of the node degrees at the right side of the graph, e.g., at layer 10' of FIG. 4 for a maximum number of left degrees of 10. These fractions can be easily converted into the left edge fractions $\lambda_i$ and the right edge fractions $\rho_i$ for all i. The distribution of the left edge degrees can be represented by the polynomial equation:

$$\lambda(x) := \Sigma \lambda_i x^{i-1}. \tag{2}$$

The edge degrees at the right side of the graph can also be represented by the polynomial equation:

$$\rho(x) := \Sigma \rho_i x^{i-1}. \tag{3}$$

The maximum fraction $\alpha$ of data items associated with nodes at the left side of the graph that can be lost so as to have a high probability that all these lost data items will be recovered can be determined by the inequality:

$$\rho(1-\alpha\lambda(1-x)) > x. \tag{4_a}$$

for all $x \in (0,1)$.

Accordingly, $\rho$ is evaluated at $1-\alpha(\lambda(1-x))$ and $\lambda$ is evaluated at $1-x$ for all $x \in (0,1)$, and this inequality must be satisfied for all $x \in (0,1)$ in order to be able to recover a missing fraction $\alpha$ of data items.

Given $\lambda(x)$ and $\rho(x)$, inequality (4a) can be solved for $\alpha$ to determine the maximum number of losses which can be experienced in the encoded message transmission while retaining a high probability of recovery of the entire message. Thus, inequality (4a) provides a verification tool which can be implemented by simply plugging in different values of $\alpha$ using, for example, a conventional binary search to determine the largest value of $\alpha$ at which the condition specified by inequality (4a) is met with the known $\rho$ and $\lambda$ values. If desired, the $\rho$ and $\lambda$ values can also be modified as may be necessary to obtain a desired $\alpha$ value.

The above inequality (4a) can also be used to determine the fraction of edges of each degree on the left-hand side of the graph, e.g., at node layer 10, which are needed to recover a desired number of transmitted data items with high probability. More particularly, the formula can be utilized to determine the optimal or near-optimal fraction of edges of each degree required at each of the nodes at the left of the graph, e.g., at layer 10, given a preselected degree of each node at the right, to ensure proper decoding of a transmitted encoded message. The optimal fraction of edges of each degree will give the highest obtainable value of $\alpha$, and hence provide the highest probability of proper decoding of the data items.

Once an appropriate sequence has been selected for the left side of the graph, inequality (4a) can be utilized to optimize the sequencing of the edges at the right side of the graph, e.g., at layer 10' using a conventional linear programming approach. For example, for a given left degree sequence, the right degree sequence can be determined to maximize the value of $\alpha$, and hence the number of data items which can be recovered. In this regard, the variable $\lambda(1-x)$ in inequality (4a) can be further represented by:

$$\Sigma \lambda_i (1-x)^{i-1} \tag{5}$$

A value z equals the following:

$$z = (1 - \alpha \lambda (1-x)) \tag{6}$$

The inequality (4a) can be represented as follows:

$$\rho_1 + \rho_2 Z + \rho_3 Z + \rho_2 Z + \ldots > x \tag{7}$$

By writing this inequality at a multitude of preferably equally spaced values of x in the interval 0,1, an equal number of inequalities arises. For example, the multitude of values for x could be x=0, x=1/100, x=2/100, . . . x=1.

Accordingly, inequality (7) can be represented by multiple inequalities for each of the values of x between 0 and 1. The x values are preferably at equally spaced intervals, although this is not mandatory. Computing inequality (7) by inserting each of the x values results in:

$$\rho_1 C_1 + \rho_2 C_2 + \rho_3 C_3 + \ldots \rho_{imax} C_{imax} > 1/100 \tag{8_a}$$

where each $C_i$=a constant that depends on the value x=1/100 and the applicable $\lambda(x)$ as described previously; and $$\rho_1 D_1 + \rho_2 D_2 + \rho_3 D_3 + \ldots \rho_{imax} D_{imax} > 2/100 \tag{8_b}$$

where each $D_i$=a similar constant that depends on the value x=2/100 and the applicable $\lambda(x)$. Each of the constants $C_i$ and $D_i$ will be known fixed values after the computation of the applicable x value and applicable $\lambda(x)$.

As discussed above, the number of edges on the left and right sides of the graph must be equal. The number of nodes on both the left and right sides of the graph are known. Hence, the family of inequalities exemplified by inequalities ($8_a$) and ($8_b$) can be solved using a linear program which can be implemented using well-known conventional techniques.

The number of inequalities within the family of inequalities exemplified by equations ($8_a$) and ($8_b$) is determined by the desired accuracy of the computation. As indicated, in the present exemplary implementation, 101 equally spaced x values are utilized. However, more or less values could be used in the computation to increase or decrease the accuracy of the result.

Increasing the number of x values will increase the processing time as well as the accuracy. Decreasing the number of x values will decrease the processing overhead as well as the accuracy of the results. A small number of x values may first be utilized to provide a rough solution for the ρ value. One or more closer spacings of the x values can then be utilized to recompute and refine the solution and more accurately determine the ρ value and hence the right edge sequence of the bipartite graph.

Also, by setting certain ρ values to zero, ρ can be computed within a desired range to reduce the processing overhead. That is, by setting certain ρ values to zero, e.g., if $\rho_2$ is set to 0, each of the equations within the family of equations exemplified by equations $(8_a)$ and $(8_b)$ will be reduced since these factors will be eliminated. This will simplify the linear programming implementation.

Further, if desired the possible ρ values can be limited to a particular number within selected ranges. The ρ values can be searched over the entire range. For example, all possible pairs of ρ values may be searched thus allowing only two possible values of ρ which are restricted to particular ranges.

The overall goal is to provide irregular random bipartite graphs of the type described above. For the analysis of the bipartite graph in a cascading series of graphs in a loss resilient code construction, the relevant question is whether a given fraction α, i.e., the fraction of the total number of data items which remain missing after all other data items are received and all redundant data items on the right side of the graph have been recovered, can be successfully recovered using the decoding process described. For a given α and ρ, a feasible solution for ρ can be found using linear programming as previously described if such a ρ exists. By doing a binary search on α, the best ρ, α for the given λ can be found:

A setting for ρ is found by solving this linear system of inequalities as described above, using standard algebraic software tools, for a given value of α. Since the number of left and right nodes for any particular graph are known, a value β can be defined such that:

$$\beta = N_R/N_L \quad (10)$$

where $N_R$ is the number of right nodes and $N_L$ is the number of left nodes for any of the bipartite graphs which may be formed between the cascading series of layers of FIG. 1, i.e., layers 10–10'''. One or more linear equations can be added to the above described linear system of inequalities such that this relationship is maintained at a desired value in finding the proper solution. One additional set of constraints is $\rho_i \geq 0$ for all i, and one additional linear inequality constant is $\Sigma_i \rho_i = 1$. The cascading loss resilient code constructions have a value β that is always less than 1.

It can be verified, if a cascading series of irregular graphs all using the same λ and ρ sequence is used between each consecutive pair of layers, e.g., between layer 10 and 10', 10' and 10", and 10" and 10''', whether or not the code is capable of recovering all of the transmitted data items from a portion of the codeword of the size (1−α/1−β) times the number of the data items, with high probability. The largest theoretically possible value of α for any λ and ρ is β. This implies that a portion of the codeword equal to the number of the data items will be necessary to recover the message. In determining the optimal λ and ρ values, the average left degree, which is determined by λ, is maintained as small as possible, as this dictates the multiplicative overhead in the running time of the encoding and decoding algorithms. Additionally, the value of α is kept as close as possible to the value of β.

In limiting the possible right degrees in the optimal graph to a particular pair, if it is presumed that the optimal or near optimal right degrees lie between 3 and 7, all ρ pairs between 3 and 7 will be utilized in the computation in an iterative process. Accordingly, only the $\rho_3$ $C_3$ and $\rho_7$ $C_7$ pair would remain in inequality $(8_a)$ and the $\rho_3$ $D_3$ and $\rho_7$ $D_7$ pair would remain in inequality $(8_b)$, etc., thereby significantly simplifying the processing. In another typical iteration when trying degrees 4 and 5 on the right for example, only $\rho_4$ $C_4$ and $\rho_5$ $C_5$ would remain in equation $(8_a)$ and only $\rho_4$ $D_4$ and $\rho_5$ $D_5$ would remain in equation $(8)_a$. This process not only increases the processing speed and reduces the processing overhead but also limits the search to a solution being sought and provides certain coding advantages which will be recognized by those skilled in the art.

As discussed above, the maximum fraction α of data items associated with nodes at the left side of the graph that can be lost so as to have a high probability that all these lost data items will be recovered can be determined by the inequality 4(a). ρ is evaluated at 1−αλ(1−x) and λ is evaluated at 1−x for all x∈(0,1). The inequality must be satisfied for all x∈(0,1) in order to be able to recover a missing fraction λ of data items.

Inequality (4a) can be solved for α to determine the maximum number of losses which can be experienced in the encoded message transmission while retaining a high probability of recovery of the entire message.

The inequality (4a) can also be used to determine the fraction of edges of each degree on the left-hand side of the graph, e.g., at node layer 10, which are needed to recover a desired number of transmitted data items with high probability. The optimal fraction of edges of each degree will give the highest obtainable value of α, and hence provide the highest probability of proper decoding of the data items. To determine an optimal or near optimal fraction of edges of each degree at each left node, inequality (4a) can be rewritten as follows:

$$\lambda = (1-\rho 1-\alpha X)) < X \quad (4_b)$$

In initiating the design of the optimal graph, a left side sequence must first be selected. Good results have been obtained using a left sequence generated using left degrees of the following form:

$$2^i + 1 \quad (12)$$

Accordingly, using equation (12) preferred λ degrees can be determined. The value of each preferred λ can be made equal. For example, if the sequence includes 10 values, then $\lambda_2^i = 1/10$ for i between 1 and 10. That is, the number of left nodes of degree $2^i$ will be proportional to $\frac{1}{2}^i$, for i between 1 and 10. In such a case, the edges will have an equal fraction of edges at each of the computed degrees within the sequence. For example using equation (12) a good left sequence would be:

$$3,5,9,17,33,2^{imax}+1 \quad (13)$$

An equal fraction of edges of each edge degree is provided for. Using left sequences of this form with the above-described techniques yields good quality codes with small average degree. The corresponding right degrees sequence can be determined using this left degree sequence and the linear programming tools described above.

Alternatively and preferably, the left distribution is the heavy tail as shown in FIG. 10 and as has been previously discussed. In this case the left node degree sequence is computed as N/i(i−1), where N equals 1+1/D and D+1 equals the maximum left degree. The corresponding right degree sequence is the Poisson distribution shown in FIG. 11.

Figure 15:
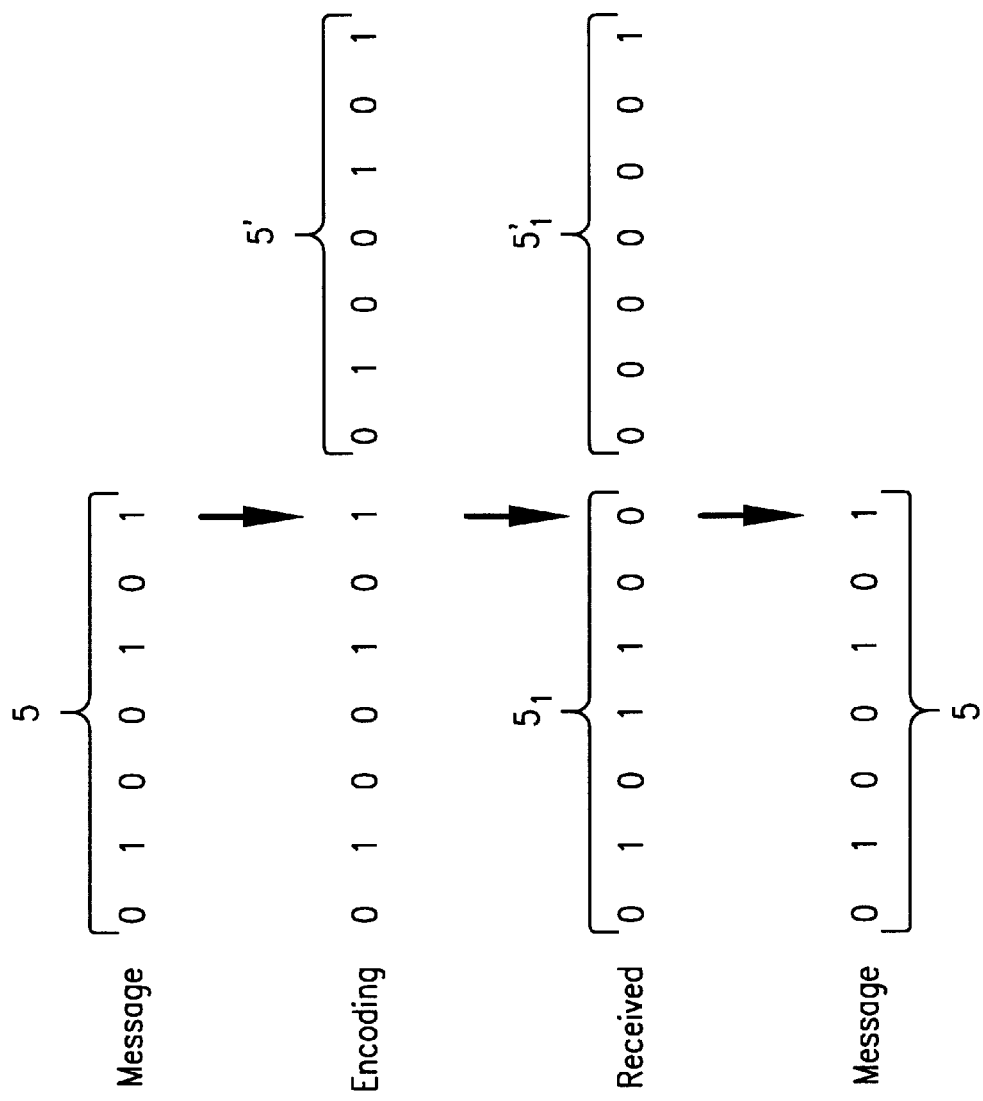
FIG. 15 is a simplified depiction of the process of encoding and decoding a message with an error correcting code.

FIG. 15 is a simplified depiction of an error correcting encoding and decoding process. A message 5 consisting of multiple data items. In FIG. 15, the data items are data bits. The data items are encoded with redundant data items 5', which are also called check items, to form a codeword before transmission. The received corrupted version of the codeword, as indicated in FIG. 15, has certain data items within received data items $5_1$ and received redundant data items $5_1'$ which have been altered. Since the data items and redundant data items in this example are bits, the alterations are flips. For example, in the received corrupted version of the codeword, the 4th, 7th, 9th and 12th bits have all been flipped. This represents 2 data items, i.e., the 4th and 7th data items, being in error. As will be recognized by those skilled in the art, such errors during transmission of data can occur due to interference which may occur in both wired and unwired communications systems. Errors occurring during transmissions of data being commonly referred to as dynamic errors. Alteration can also occur on a magnetic, electromagnetic or optical disk. Such errors are often referred to as static errors. Accordingly, such errors can occur both in communications and storage of data.

Error correcting performance is generally measured in terms of the encoding and decoding times as well as the number of corrupted data items which can be corrected with a high probability or decoding guarantee.

Although FIG. 15 depicts 7 data items, in practice a message might encompass an entire block of data and include 1,000 to 2,000 bits or more. The present invention, as indicated above, is particularly beneficial when the number of data items is relatively large, say over 100 data items. Performance actually increases as the number of data items to be recovered increases. Hence, although excellent performance is provided in recovering a message of 1,000 data items, even better performance is obtained if the message is 100,000 data items in length.

Figure 16:
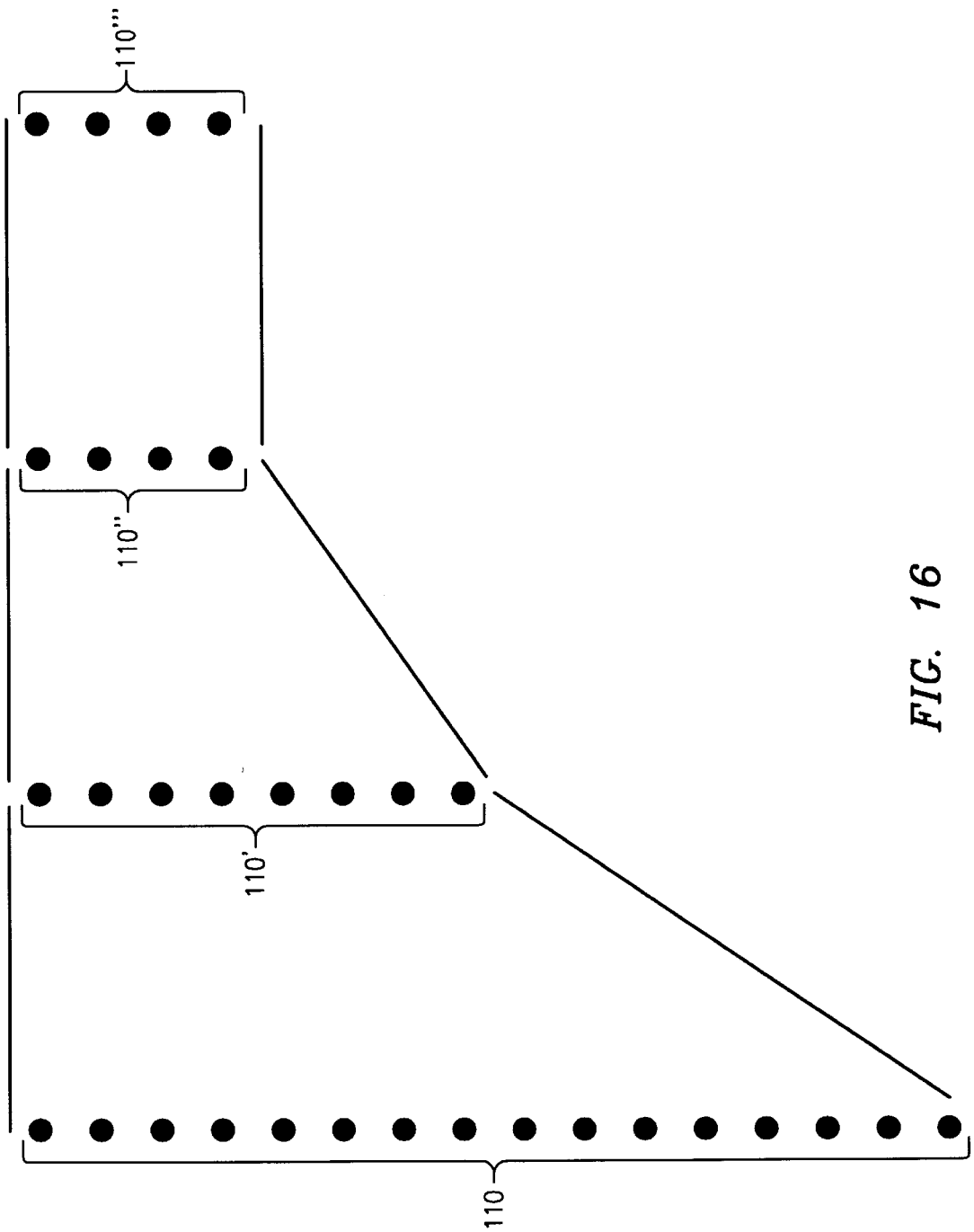
FIG. 16 depicts an error correcting cascading encoding structure in accordance with the present invention.

FIG. 16 depicts an error correcting encoding structure in accordance with the present invention. FIG. 16 is similar to FIG. 4. As shown, the layer 110 includes 16 data items. As noted above, in practical implementations, the number of data items in layer 110 is likely to be significantly larger.

The first redundant layer 110' includes 8 redundant data items, hence representing a stretch at layer 110' of 0.5. Redundancy layer 110'" includes 4 redundant data items which adds an additional stretch factor of 0.25. The layer 110'" includes 4 redundant data items, hence adding an additional 0.25 stretch factor. Accordingly, as shown the error correction encoding structure depicted in FIG. 16 has a stretch factor of 2, and hence a codeword having as many redundant data items as data items at layer 110.

As discussed above with respect to the loss resilient encoding structure of FIG. 4, the depicted structure is truncated at the layer 110'" but could be extended out such that layer 110'" includes only two redundant data items and a further layer is provided with a single redundant data item. Accordingly, if desired, the cascading structure shown could consistently shrink by 50% at each layer, although this is not preferred. The layer 110'" consists of redundant data items which can be created using any of various error correcting techniques which will allow the truncating of the structure at the desired layer. For example, a low-density parity check code defined by a graph similar to that used between the other layers is particularly suitable for this purpose.

Figure 17:
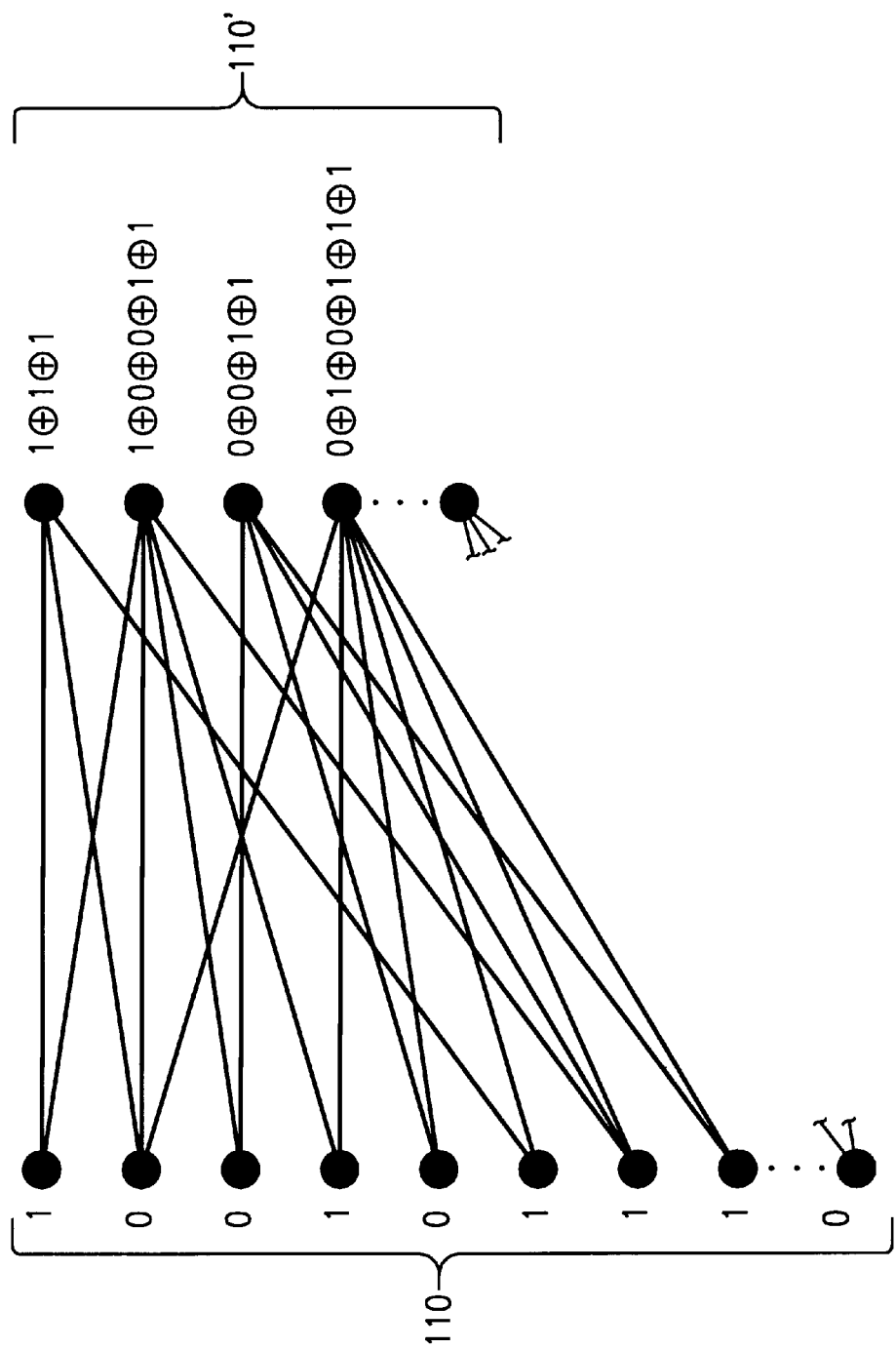
FIG. 17 depicts an irregular graphing of the edges between node layers in the FIG. 16 encoding structure in accordance with the present invention.

FIG. 17 depicts the edges associated with the nodes at layers 110 and 110'. The data items associated with nodes at layer 110 are connected via the edges to the redundant data items associated with the nodes at layer 110'. The redundant data items associated with nodes at the layer 110' are computed by an exclusive-or operation of the message bits to which they are connected.

For example, the first or upper node of layer 110' will have a value of 0, i.e., the exclusive-or of the data items at the 1st, 2nd and 6th nodes of layer 110. The value of each of the other redundant data items associated with the nodes at layer 110' will be similarly computed by an exclusive-or operation of the values of the data items associated with the level 110 nodes to which they are connected by edges. Subsequent redundant layers, i.e., 110" and 110'", will be formed in exactly the same manner. Hence, the values of the redundant data items associated with the nodes at level 110'" will likewise correspond to the values of the redundant data items associated with the nodes at level 110' to which they are connected by edges. Although an exclusive-or operation is preferred, a group operation or ring operation or some other operation could be utilized if so desired.

Figure 18:
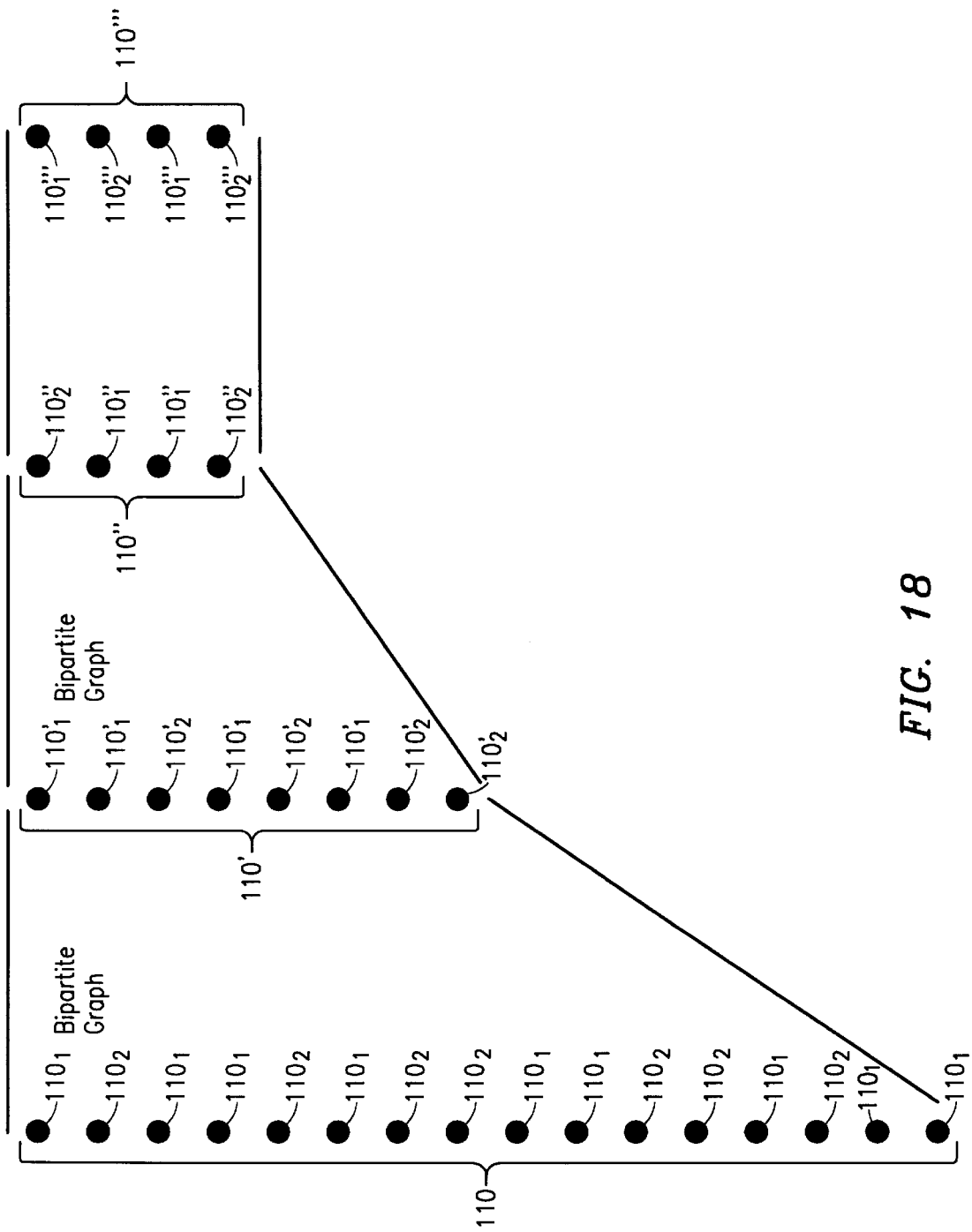
FIG. 18 depicts a received encoded message which has an encoding structure as shown in FIG. 16.

FIG. 18 depicts the received encoded message. As indicated data items designated $110_2$ have been corrupted and accordingly the data item has been altered. Data items which have been correctly received are designated $110_1$. Likewise, redundant data items at level 110' which are correct are designated $110'_1$ and those which have been corrupted are designated $110'_2$. At level 110" the correct redundant data items are designated $110''_1$ and the corrupted redundant data items are designated $110''_2$. Finally at level 110'", the correct redundant data items are designated $110'''_1$ and the incorrect or erroneous redundant data items are designated $110'''_2$. Since all items in this example are bits, the erroneous bits have flipped either from 0 to 1 or from 1 to 0.

In order to decode the data items at level 110, the technique must be able to determine that an error exists and the location of the corrupted data item. To properly decode corrupted bits conventional belief propagation is utilized. Belief propagation is described in detail in "The Forward-Backward Algorithm" by G. David Forney, Jr. in Proceedings of the 34th Allerton Conference on Communication, Control, and Computing (October, 1996), pp. 432–446. Decoding occurs from right to left, i.e., from level or layer 110'" to level or layer 110 one layer at a time.

Figure 19:
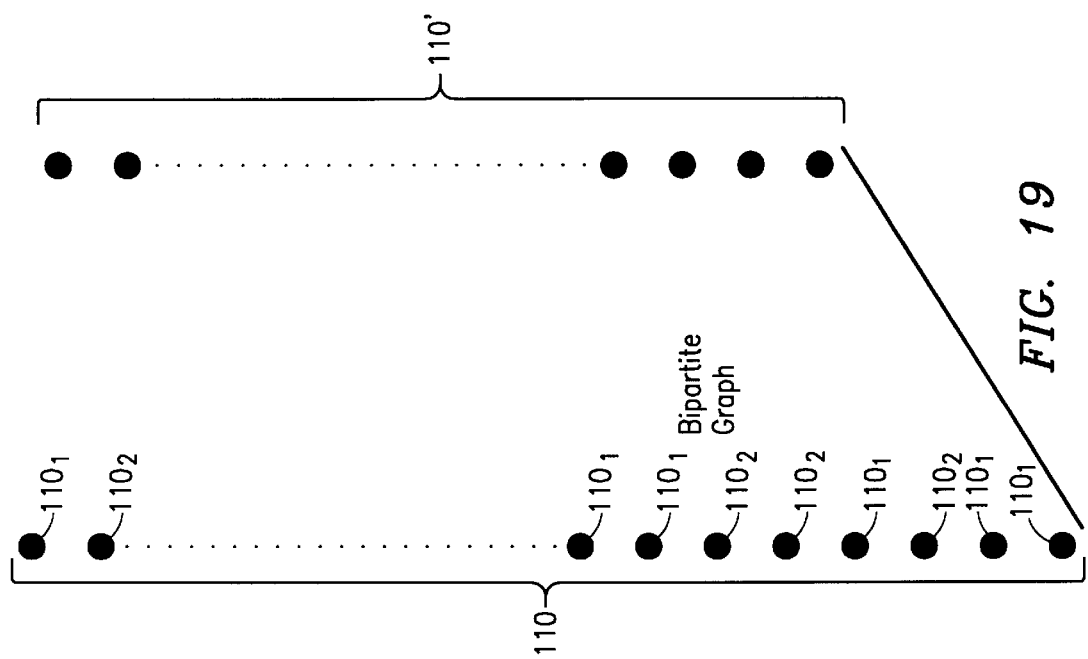
FIG. 19 depicts the decoding process for the error correction code in accordance with the present invention.

As shown in FIG. 19 certain of the data items in layer 110 remain corrupted. The corrupted data items are designated $110_2$. All redundant data items in the layer 110' have been either properly received or corrected based upon information in layer 110". The layer 110' has been corrected using the same techniques as will be described below. Accordingly, the data items at layer 110 must now be corrected utilizing the redundant data items associated with layer 110'.

Figure 20:
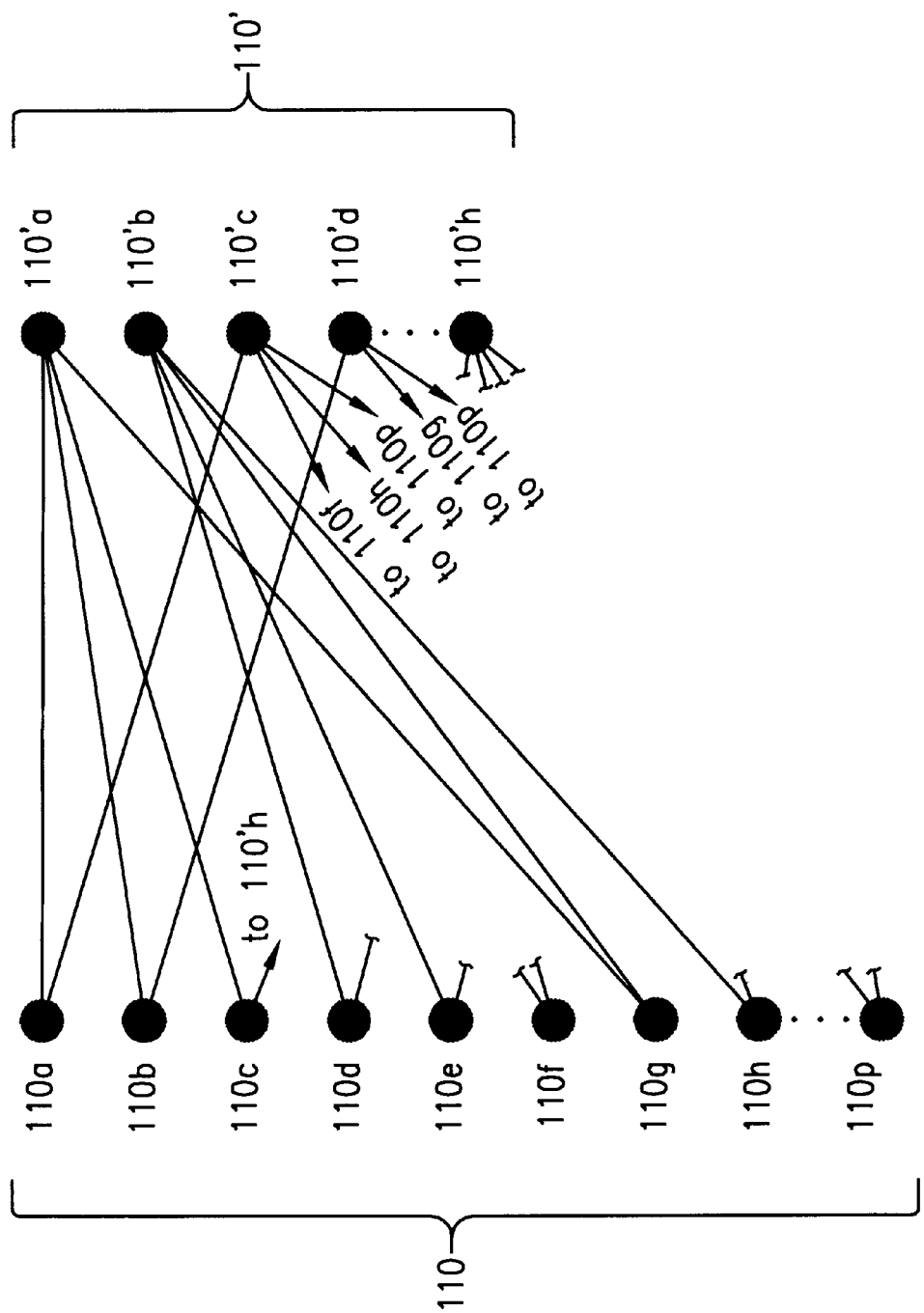
FIG. 20 depicts the graphing of the edges between nodes of the layers shown in FIG. 19 at the receiving end of a transmission in accordance with the present invention.

FIG. 20 depicts a graphing of the nodes at level 110 to the nodes at level 110'. The nodes at level 110 have been designated 110a–110p. The nodes at layer 110' have been designated 110'a–110'h. A determination must be made if the data item at node 110a is correct. Accordingly, as indicated by the single level belief propagation of FIG. 21, the data item at node 110a will be checked with each of the redundant data items at nodes to which it is connected by an edge, i.e., nodes 110'a–110'c. For the remainder of the description of the belief propagation decoding technique, it will be assumed that all data items are message bits and all redundant data items are check bits, with the understanding that this assumption is merely for the purpose of illustration and that this technique can be used even if this assumption is not made. Similarly, it will be assumed that the operation used to determine the values of the check bits will be exclusive-or.

In order to determine if node 110a is correct, each of the check bits at the nodes with which it is connected will be operated upon to determine if the value associated with node 110a is correct. That is, an exclusive-or operation will be performed using the bit values from node(s) 110'a, 110b, 110c and 110g and compared with the bit value associated with check node 110a. If the exclusive-or operations result in the value of the bit associated with node 110'a, the received bit value associated with node 110a is correct. Similar operations will be performed with respect to the check bits associated with nodes 110'b and 110'c.

If for example, two of the bits associated with nodes connected by edges to node 110'b, i.e., 110e and 110g, are incorrect, the errors will be offsetting and accordingly the error will go undetected at check bit 110'b. If one of the bits connected by an edge to node 110'c is in error, the error will be detected in the exclusive-or of the bits associated with nodes 110a, 110f, 110n and 110p.

For a given system implementation, the probability that an individual bit, e.g., the bit associated with node 110a, will be corrupted will be known. For example, for a given implementation, the probability of a bit being flipped may be 5%. Further, based upon the check bit analysis performed with respect to the bit value associated with node 110a, the probability of the received bit value at node 110a being correct can be determined for that particular node. The probability for each of the nodes 110a–110p can be computed very efficiently in parallel using well-known techniques. In practice, these probabilities will be associated with the edges connecting to the nodes at layer 110 rather than the nodes themselves. Although preferably the probability that the bit value is correct is determined for each of the nodes at layer 110 in parallel, if desired this determination could be made sequentially.

Figure 21:
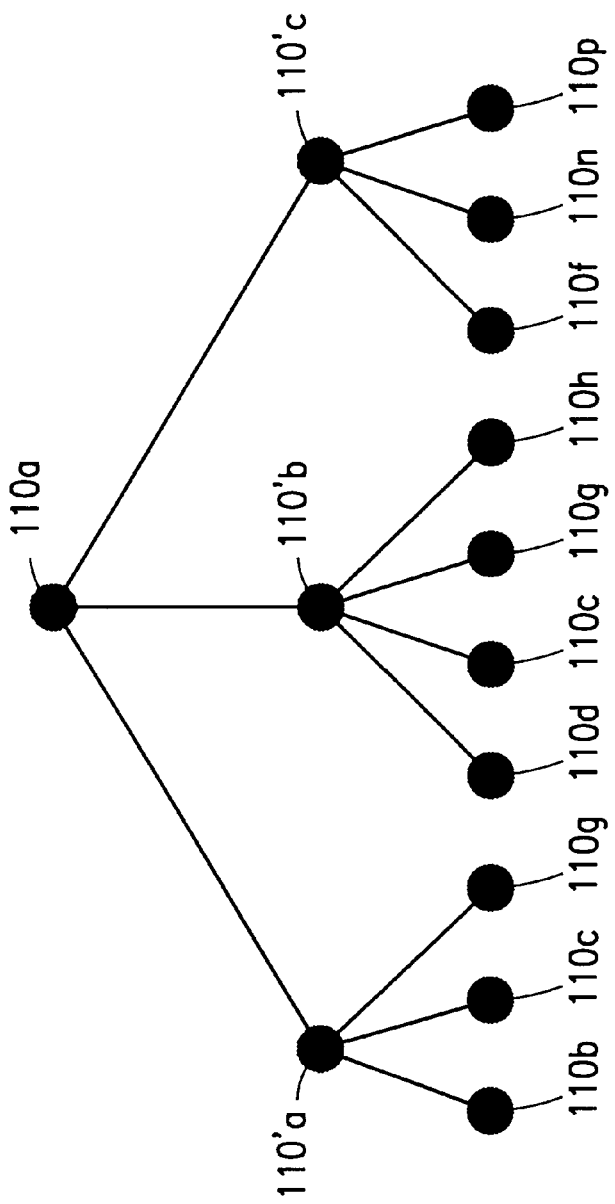
FIG. 21 depicts one level of belief propagation for a node depicted in FIG. 20.
Figure 22:
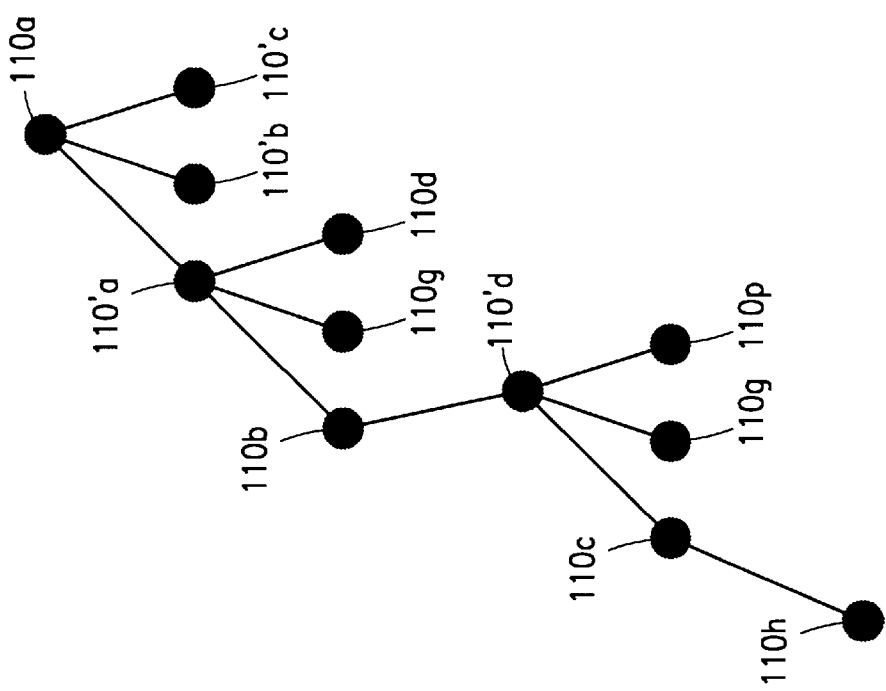
FIG. 22 depicts a further extension of the belief propagation shown in FIG. 21.

FIG. 22 depicts a further extension of the belief propagation depicted in FIG. 21. As indicated, the determination as to whether or not the received bit value associated with node 110a is correct or incorrect can be extended. In the extended analysis the probability that the received bit value associated with node 110b, etc., is correct is computed by looking to the other check bits, e.g., check bit at node 110'd and received bits associated with nodes 110c, 110g and 101p. Further, the value associated with node 110c can be checked using the check bit associated with node 110'h, etc.

The propagation tree of FIG. 22 would extend out for each of the check bits at nodes 110'a–110'c and for each of the bits at each layer of the propagation tree. Accordingly, the likelihood or probability that the received bit value associated with node 110a is correct can be determined on the basis of the probabilities at multiple levels of determination as indicated by FIG. 20. In this way, the conditional probability that the received bit value associated with each of the nodes at layer 110 is correct can be determined.

Advantageously, the probabilities for each of the nodes at layer 110 will move either close to 100% probability or 0% probability as the computations move lower and lower on the belief propagation tree shown in FIG. 22. The probability for each received bit value associated with a layer 110 node is updated after each level of computation on the belief propagation tree. By performing the computations in parallel for each of the layer 110 nodes, the respective probabilities associated with each node are updated simultaneously and the bit value associated with each node at layer 110 adjusted in accordance with the current probability information and checked against its check bits. Preferably, the parallel computations are performed using standard dynamic programming techniques, which allow much faster computation than a naive implementation would.

More particularly, after completing the check to a belief propagation tree level indicated on FIG. 22 for all received bits associated with layer 110, those bits that are determined at this point to have a low probability of being correct are flipped and the bit values, as adjusted, are checked against the check bits at layer 110'. If this simple check against the check bit results in a match between each of the check bit values and the exclusive-or of the layer 110 bits connected by an edge to the node with which the check bit is associated, the adjusted check bits are correct and the probability computation can end without proceeding down to further levels of the belief propagation tree. However, if any one of the check bit values associated with the nodes at level 110' fails to match the exclusive-or of the connect data bits associated with the layer 110 node(s), then at least one of the bit values associated with layer 110 remains corrupted and a further probability computation is performed at the next level of the belief propagation tree.

It should be noted that there is a very small possibility that there will be an incorrect determination that all data bits at layer 110 have been corrected. This can occur if an even number of bits remain corrupted and offset each other in the exclusive-or operations which are performed to determine whether each of the check bits can be matched using the data bits, as adjusted. However, this is very unlikely to occur in practical implementations and can generally be ignored.

In the foregoing description of loss resilient encoding of data items, irregular graphs which are particularly suitable for lost resilient codes were described in detail. This irregular graphing is preferably used in the connecting of the edges of the nodes at layers 110–110"' described above in connection with error correcting codes.

Any bit at layer 110 which fails to be received is replaced by a randomly selected bit having a value of either 0 or 1 and corrected in the manner described above using the belief propagation determination. Here again, the bit values at high degree nodes on the left side of the graph are beneficial in that they will tend to be corrected first. The nodes having a relatively low degree or low number of edges on the left side of the graph are corrected using the corrected values associated with the higher degree nodes. Hence, in practice, the bit values associated with different nodes of different degrees will correct themselves at different phases or levels of the probability determinations made using the belief propagation tree.

The decoding of the error correction codes, differs from the decoding of the loss resilient codes in that, not only is a belief propagation probability determination performed in decoding the error correcting codes, but also the correctness of the data bits at the layer 110 is determined globally, i.e., simultaneously for all data bits. In decoding the loss resilient codes, message recovery occurs on an item by item basis.

In implementing the above-described technique for bit error correction, it is beneficial to establish a reasonable threshold of rounds or levels of belief propagation computations which will be performed to correct corrupted bits. If the determination does not converge on the correct solution within the threshold number of rounds, the decoding ends and the then adjusted message bits can be either discarded or utilized as is. For example, even if the decoding does not converge on the correct solution within say 200 rounds or levels of probability determinations using the belief propagation technique, a sufficient number of the corrupted bits will have been corrected to provide significantly enhanced data quality as compared to the originally received message data bits. Thus, the message bits, as corrected, may be entirely suitable for use in applications such as video distribution. On the other hand in other applications, e.g., bank data transmissions, only correct data is acceptable. Accordingly in these latter implementations, if the decoding does not converge upon a correct solution within the threshold number of rounds, the bit data is discarded and, for example, a retransmission of the data will be required. So long as a reasonable threshold is selected, even if a complete correction does not occur within the threshold number of levels or rounds of belief propagation, most errors in the received bits will have been corrected within the threshold and accordingly for many applications, the data can be utilized for its intended purpose.

Figure 23:
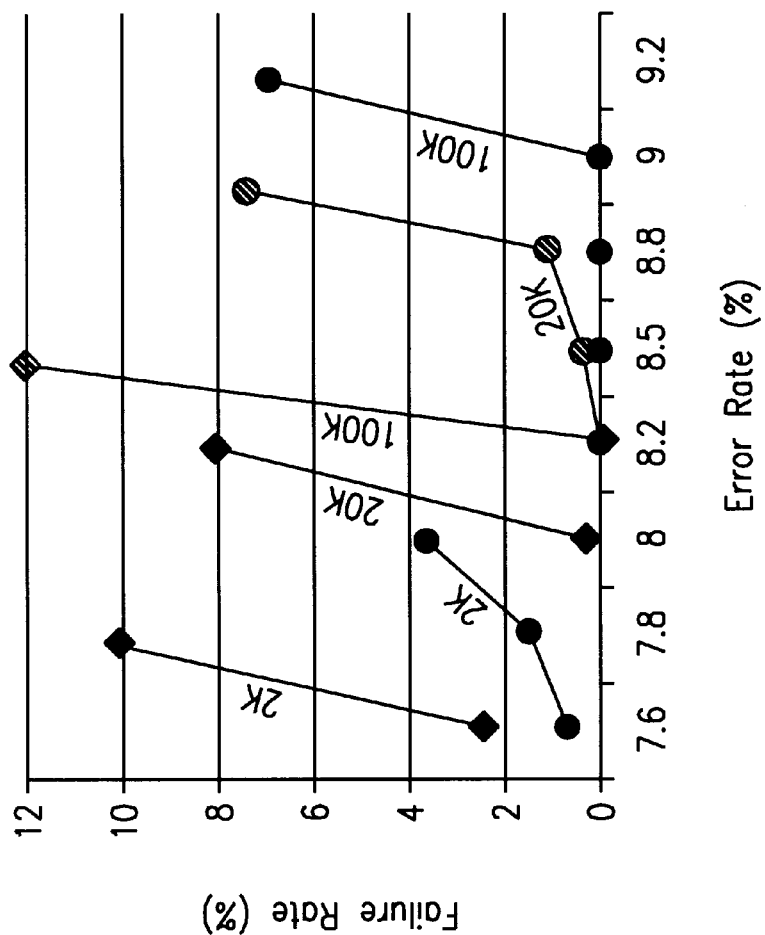
FIG. 23 graphs the failure rate versus the error rate utilizing the error correcting code in accordance with the present invention.

FIG. 23 depicts the results obtainable utilizing the error correction technique described above. The error rate, i.e., the probability that a bit is corrupted and therefore has been flipped, is plotted against the failure rate, i.e., the rate at which the above-described technique fails to converge upon the correct solution within the given threshold, in this case, 200 rounds or levels of belief propagation determinations. It should be kept in mind, as previously discussed, the maximum theoretical error rate which is correctable is 11%. For example at an error rate of 8%, this corresponds to exactly 8% of the bits within the received block of data having been corrupted and hence flipped. The failure rate indicates the percentage of times that decoding was attempted but failed to converge upon the correct solution. For example, at a failure rate of 10%, if a block of data of a particular bit length were received with a particular number of flipped bits on 100 different occasions, in attempting to decode the received blocks of data, in 10 cases out of 100 the received data would not be completely corrected after the threshold number of rounds of belief propagation.

FIG. 23 represents the failure rate of belief propagation decoding at various error rates applied to a transmitted codeword as described in FIG. 16. That is, the total number of check bits equals the total number of data bits and half of these check bits are associated with layer 110' while ¼ of these check bits are associated with layer 110" and ¼ of these check bits are associated with layer 110'". The edges are irregularly mapped such that the nodes at each layer have a varying number of edges, i.e., the number of edges are different for different nodes. For example, as shown in FIG. 17, the 1st, 3rd, 4th, 5th and 6th nodes at layer 110 each have two edges while the 2nd and 7th nodes at layer 110 have three edges connecting to nodes at layer 110'. The edges are connected randomly between the left and right layers. The failure rate for decoding regularly graphed conventionally encoded message bits at a particular error rate and associated block or message bit length is also indicated by the lines with diamonds at their ends. The failure rate for decoding irregularly graphed encoded message bits is indicated by the graph lines having circular intersection or end points.

As shown in FIG. 23 with a message bit length of 2,000 bits, i.e., the number of bits at the left hand side of the cascading structure, the failure rate using the techniques described above provide a much lower failure rate than those obtainable with regular graphing of the left and right nodes utilized in conventional error correction encoding. Additionally, a much higher error rate can be tolerated. Further, as the number of data bits increases, the benefit over the conventional techniques also continues to increase dramatically, as indicated by the graph lines for blocks having bit lengths of 20,000 and 100,000 bits.

For example, with blocks having 20,000 bits of data, an error rate of approximately 8% can be tolerated using conventional techniques. Using the techniques described above, an error rate of almost 9% can be tolerated. Increasing still further to blocks having 100,000 data bits, using conventional techniques the tolerable error rate remains relatively close to 8%. Using the techniques described herein, an error rate of over 9% can be reasonably tolerated. It should also be noted that for blocks having 100,000 bits of data, the received data can be completely corrected up to an error rate of 9% without failure. Whereas, using conventional techniques at an error rate of approximately 8.5% the failure rate would be close to 99% (not shown). In cases where the number of check bits equals the number of data bits, a theoretical maximum correctable error rate is 11%. Accordingly, even small gains over the error rates correctable using conventional techniques is significant in practical applications. Using the above-described techniques, 9% or more of the transmitted data bits can be corrected with a high probability and low failure rate.

Figure 24:
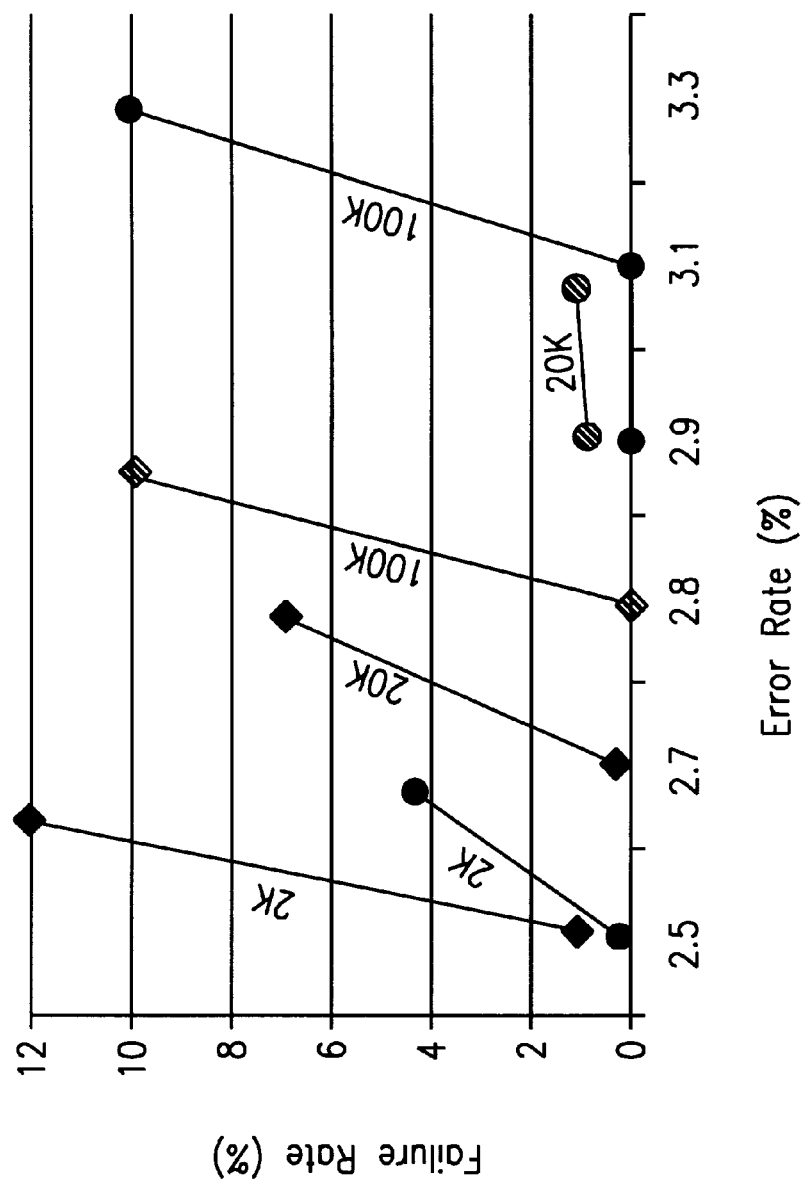
FIG. 24 is similar to FIG. 23 but reflects a different redundancy ratio.

FIG. 24 is similar to FIG. 23 but reflects a cascading irregular graph structure with one-third as many check bits as data bits. Referring to FIG. 16, if the number of nodes at layer 110 is 144, then such a structure would have 36 rather than 8 nodes at layer 110', 9 rather then 4 nodes at layer 110" and 3 rather than 4 nodes at layer 110'". Since the redundancy has been reduced, the error rate percentages in FIG. 24 are lower than those reflected in FIG. 23. However, the reflected decoding behavior is similar to that described above with reference to FIG. 23. As indicated in FIG. 24, the decoding of blocks of data bits which have been irregularly encoded provide substantially better results than the decoding of blocks of data bits encoded using conventional techniques. In the case of 4 to 1 cascading, the maximum theoretical error rate which can be corrected is approximately 4%.

It will be recognized by those skilled in the art that the processing time required to perform the belief propagation as described above should be taken into account in implementing the invention. However, in certain implementations, such as error correction of data transmitted via satellite or retrieved from a storage device, the processing time required to converge on a complete solution may be of little or no consequence.

In any event, the processing time for performing the belief propagation in accordance with the above-described techniques will be proportional to the number of edges associated with a particular graph, e.g., the graph of edges between layer 110 and 110'. This is because of the time required for the belief propagation update which updates the values of all the edges for each round or level of the belief propagation tree. The processing time will also be proportional to the number of rounds or levels required to converge on the correct solution.

Irregular graphs of the type described herein may include more edges than required to regularly graph data bits to redundant data items or redundant data items to a further layer of redundant data items using regular graphing. However, using the techniques described above, convergence on the proper solution will generally occur in fewer rounds of belief propagation than the number of rounds required to obtain the same convergence using conventional regular graphing techniques. Based upon the experimentation performed, it appears that the processing time required to implement the above-described technique is approximately the same as that required to implement conventional techniques to correct corrupted data bits in a received message.

This processing time can be reduced dramatically if so desired by performing the following operations in lieu of the belief propagation previously described. Rather than performing belief propagation, a check is performed for each node at the left side of the graph, e.g., at the layer 110 nodes of FIG. 20, with each check bit associated with a node at the right side layer, e.g., at layer 110', connected by an edge to the applicable left side node. All data bits associated with nodes in layer 110 are updated at the same time based upon a probability determination made by considering only those check bits to which the data bit is connected by an edge.

For example, referring to FIG. 20, if check bits 110'$a$ and 110'$b$ do not match with an exclusive-or of the layer 110 data bits to which they are connected, but the check bit 110'$c$ does match with an exclusive-or of the data bits to which it is connected by edges, it would indicate that the data bit 110$a$ may be corrupted. A similar operation would be performed for each of the data bits at layer 110.

Those bits which appear to be corrupted, based upon the failure of the matching at say a majority of the check bits to which they are connected, would all be flipped simultaneously. All bits at layer 110 would then again be checked against the check bits at layer 110'. Bits would continue to be flipped based upon the results of the matching in this same manner until all check bits at layer 110' match the exclusive-or of the associated data bits to which they are connected. Accordingly, only information on a per node basis is required to be maintained and the processing time is reduced substantially from that required for belief propagation processing.

Using this latter technique individual bits associated with the nodes at the left side of the graph may flip multiple times in order to converge on the correct solution and complete the decoding. Beneficially a match or non-match with a check bit associated with a node having a higher number of edges is weighed lower than a match or non-match with a check bit associated with a node having a lower number of edges. This is because, if a non-match is detected with a check bit having only a small number, say three, of data bits connected to it, the probability that any of the three data bits is corrupted is high. If a non-match with a check bit connected to 10 data bits occurs, the probability of any one of those 10 data bits being corrupted is relatively small.

Figure 25:
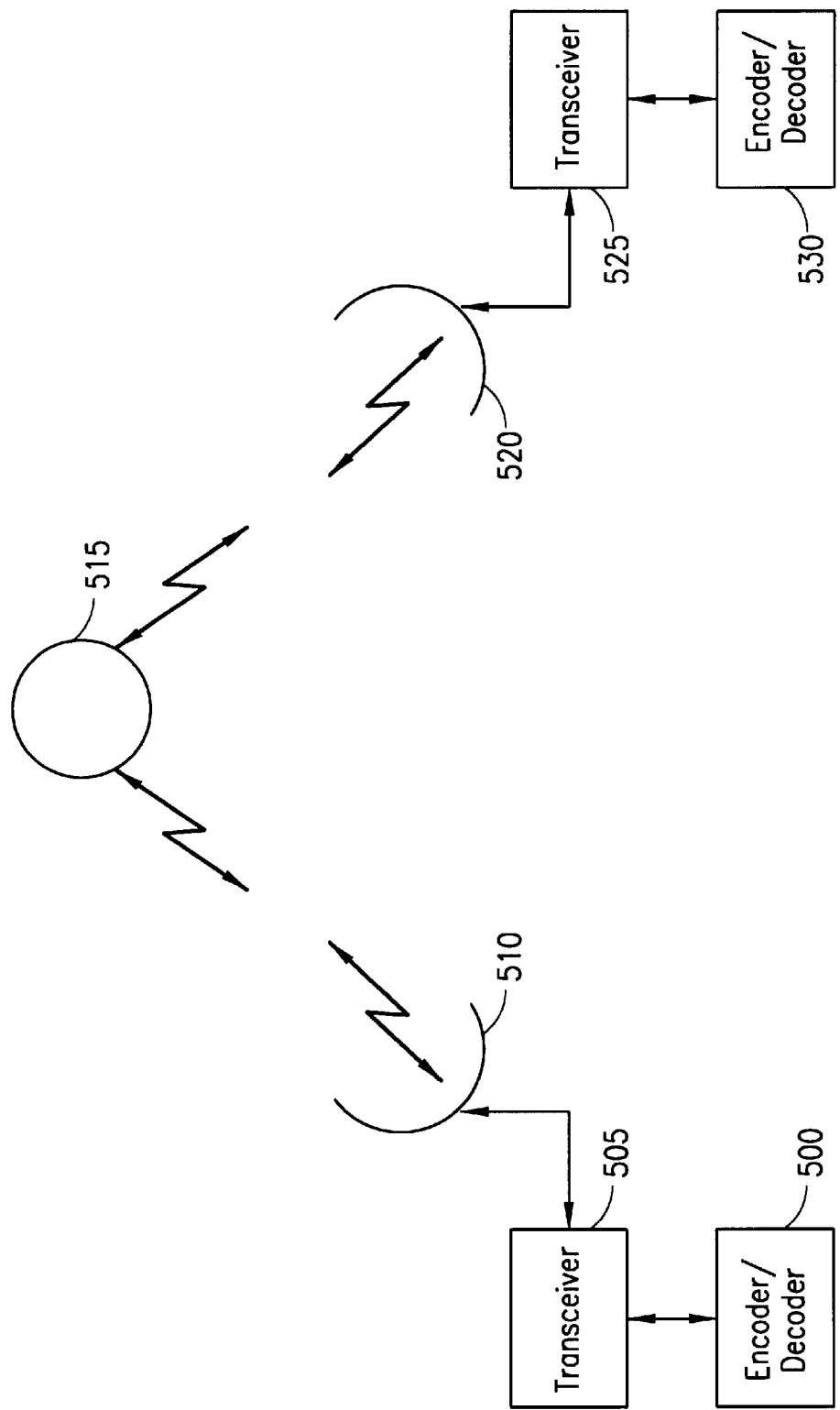
FIG. 25 depicts a simplified communication link over which messages encoded in accordance with the present invention can be transmitted and decoded.

FIG. 25 depicts a simplified communication transmission link over which messages encoded and decoded in accordance with the present invention can be transmitted. As shown, an encoder/decoder 500 encodes a message as described above and forwards the encoded message to the transceiver 505. The message is transmitted via a satellite transmitting antenna 510 to a satellite 515. The satellite transmits the received encoded message on a downlink which is received at the satellite antenna 520 and forwarded to the transceiver 525. The received encoded message is passed to the encoder/decoder 530 where it is decoded in accordance with the above-described techniques.

As described above in detail, the present invention provides a technique for creating loss resilient and error correcting codes which substantially reduces the time required to encode and decode messages. The messages are encoded so as to facilitate recovery and/or correction of a large quantity of message data which has been lost or corrupted during transmission or storage, with improved efficiency and a high probability that the message will be properly decoded.

It will also be recognized by those skilled in the art that, while the invention has been described above in terms of one or more preferred embodiments, it is not limited thereto. Various features and aspects of the above described invention may be used individually or jointly. Further, although the invention has been described in the context of its implementation in a particular environment and for particular purposes, those skilled in the art will recognize that its usefulness is not limited thereto and that the present invention can be beneficially utilized in any number of environments and implementations, e.g. teaching neural networks and vision networks. Accordingly, the claims set forth below should be construed in view of the full breadth and spirit of the invention as disclosed herein.

We claim:

1. A method of encoding a message including a plurality of data items, comprising the steps of:

identifying a maximum number of first edges and a minimum number of first edges to be associated with the plurality of data items, the maximum number and the minimum number being different positive integer values;

computing a first distribution of different numbers of first edges, ranging from the maximum number of first edges to the minimum number of first edges, to be associated with the plurality of data items;

establishing a first associated number of first edges for each data item within the plurality of data items, the different numbers of first edges being associated with the plurality of data items according to the computed first distribution;

identifying a maximum number of second edges and a minimum number of second edges to be associated with a plurality of redundant data items, the maximum number and the minimum number being different positive integer values;

computing a second distribution of different numbers of second edges, ranging from the maximum number of second edges to the minimum number of second edges, to be associated with the plurality of redundant data items;

establishing an associated number of second edges for each redundant data item within the plurality of redundant data items, the different numbers of second edges being associated with the plurality of redundant data items according to the determined second distribution;

determining a number of the plurality of data items which are one of (i) recoverable if lost and (ii) correctable if corrupted, from an encoded message formed of the plurality of data items and the plurality of redundant data items, with each of the plurality of redundant data items corresponding to a number of the plurality of data items equal to the associated number of second edges;

establishing a threshold number of lost/corrupted data items; and forming an encoded message having the plurality of redundant data items corresponding to the plurality of data items according to the first distribution and having the plurality of data items corresponding to the plurality of redundant data items according to the second distribution only if the number of the plurality of data items which are determined to be one of (i) recoverable and (ii) correctable exceeds the threshold.

2. A method of encoding a message according to claim 1, further comprising the step of:

transmitting the formed encoded message.

3. A method of encoding a message according to claim 1, further comprising the step of:

prior to forming the encoded message, randomly selecting those of the plurality of data items to which each of the plurality of redundant data items will corresponds.

4. A method of encoding a message according to claim 1, wherein:

the plurality of data items includes a number of data items;

the plurality of redundant data items includes a number of redundant data items; and the number of data items exceeds the number of redundant data items.

5. A method of encoding a message including a plurality of data items and a plurality of redundant data items, comprising the steps of:

associating each data item within the plurality of data items with a number of first edges, within a first set of different numbers of first edges, the different numbers of first edges being associated with the plurality of data items according to a first distribution;

associating each redundant data item within the plurality of redundant data items with a number of second edges, within a second set of different numbers of second edges, the different numbers of second edges being associated with the plurality of redundant data items according to a second distribution;

determining a number of the plurality of data items within an encoded message which are one of (i) recoverable if lost and (ii) correctable if corrupted, from an encoded message formed of the plurality of data items and a plurality of redundant data items, each of the plurality of redundant data items corresponding to a number of the plurality of data items equal to the associated number of second edges;

establishing a threshold number of lost/corrupted data items;

determining a number of the plurality of data items which are one of (i) recoverable and (ii) correctable; and forming an encoded message having the plurality of redundant data items corresponding to the plurality of data items according to the first distribution and having the plurality of data items corresponding to the plurality of redundant data items according to the second distribution only if the number of the plurality of data items which are one of (i) recoverable and (ii) correctable is determined to equal or exceed the threshold.

6. A method of encoding a message according to claim 5 wherein:

the number of the plurality of data items which are recoverable, expressed as a fraction, is $\alpha$ and is determined by applying the formula $\rho(1-\alpha\lambda(1-x))>x$ for all $x\in[0,1]$, where $\rho$ corresponds to the second distribution and $\lambda$ corresponds to the first distribution.

7. A method of encoding a message according to claim 5, wherein the first set of different numbers of first edges is bounded by a maximum number of first edges and a minimum number of first edges, and further comprising the steps of:

changing the maximum number of first edges;

associating each data item within the plurality of data items with a second associated number of first edges, within a second set of different numbers of first edges bounded by the changed maximum number of first edges, the different numbers of first edges within the second set being associated with the plurality of data items according to a third distribution different than the first distribution;

associating each redundant data item within the plurality of redundant data items with a second associated number of second edges, within a fourth set of different numbers of second edges, the different numbers within the fourth set of second edges being associated with the plurality of redundant data items according to a fourth distribution different than the second distribution;

determining a number of the plurality of data items which are one of (i) recoverable and (ii) correctable; and forming an encoded message having the plurality of redundant data items corresponding to the plurality of data items according to the third distribution and having the plurality of data items corresponding to the plurality of redundant data items according to the fourth distribution only if the number of the plurality of data items which are one of (i) recoverable and (ii) correctable is determined to exceed the threshold.

8. A method of encoding a message according to claim 7, wherein the encoded message having the plurality of redundant data items corresponding to the plurality of data items according to the first distribution and the plurality of data items corresponding to the plurality of redundant data items according to the second distribution has a length different than the length of the encoded message having the plurality of redundant data items corresponding to the plurality of data items according to the third distribution and the plurality of data items corresponding to the plurality of redundant data items according to the fourth distribution.

9. A method of encoding a message according to claim 7, wherein the sum of the number of first edges associated with the plurality of data items is different than the sum of the second associated number of first edges associated with the plurality of data items.

10. A method of encoding a message according to claim 7, wherein the sum of the number of second edges associated with the plurality of redundant data items is different than the sum of the second associated number of second edges associated with the plurality of redundant data items.

11. A method of encoding a message according to claim 5, wherein:

the plurality of data items includes a number of data items;

the plurality of redundant data items includes a number of redundant data items; and the number of data items exceeds the number of redundant data items.

12. A method of encoding a message, comprising the steps of:

identifying a maximum number of first edges and a minimum number of first edges to be associated with a plurality of data items, the maximum number and the minimum number being different positive integer values;

determining a distribution of different numbers of first edges, ranging from the maximum number of first edges to the minimum number of first edges, to be associated with the plurality of data items;

establishing an associated number of first edges for each data item within the plurality of data items, the different numbers of first edges being associated with the plurality of data items according to the distribution;

identifying a maximum number of second edges and a minimum number of second edges to be associated with a plurality of redundant data items, the maximum number and the minimum number being different positive integer values;

determining a Poisson distribution of different numbers of second edges, ranging from the maximum number of second edges to the minimum number of second edges, to be associated with the plurality of redundant data items;

establishing an associated number of second edges for each redundant data item within the plurality of redundant data items, the different numbers of second edges being associated with the plurality of redundant data items according to the Poisson distribution;

connecting each second edge to a respective first edge;

forming the plurality of redundant data items such that each of the plurality of redundant data items represents those of the plurality of data items to which the redundant data item is connected by first and second edges; and forming an encoded message including the plurality of data items and the plurality of redundant data items.

13. A method of encoding a message according to claim 12, wherein the minimum number of first edges is 2.

14. A method of encoding a message according to claim 12, wherein:

the maximum number of first edges is D+1;

a constant N equals 1+1/D; and the distribution of numbers of first edges is computed by $N/i(i-1)$, where i is a number of first edges within the range of numbers of first edges.

15. A method of encoding a message according to claim 12, wherein:

the plurality of data items includes a first number of data items;

the plurality of redundant data items includes a second number of redundant data items;

the first number is larger than the second number; and the maximum number of second edges is equal to the maximum number of first edges multiplied by a factor, the numerator of which is the first number and the denominator of which is the second number.

16. A method of encoding a message according to claim 12, wherein the minimum number of second edges is 1.

17. A method of encoding a message according to claim 12, wherein:

the associated number of first edges for each data item within the plurality of data items is established by random assignment of the different numbers of first edges to respective of the plurality of data items so as to provide the distribution of the numbers of first edges; and the associated number of second edges for each redundant data items within the plurality of redundant data items is established by random assignment of the numbers of second edges to respective of the plurality of redundant data items so as to provide the Poisson distribution of the numbers of second edges.

18. A method of encoding a message according to claim 12, wherein each second edge is randomly connected to a respective one of the first edges.

19. A method of encoding a message according to claim 12, wherein each of the plurality of redundant data items is an exclusive-or of the those of the plurality of data items to which the redundant data item is connected by first and second edges.

20. A method of encoding a message, comprising the steps of:

determining a first distribution of different numbers of first edges ranging from a maximum number of first edges to a minimum number of first edges, to be associated with a plurality of data items;

establishing an associated number of first edges for each data item within the plurality of data items, the different numbers of first edges being associated with the plurality of data items according to the first distribution;

determining a second distribution of different numbers of second edges, ranging from a maximum number of second edges to a minimum number of second edges, to be associated with the plurality of redundant data items;

establishing an associated number of second edges for each redundant data item within the plurality of redundant data items, the different numbers of second edges being associated with the plurality of redundant data items according to the second distribution;

connecting each second edge to a respective first edge;

forming the plurality of redundant data items such that each of the plurality of redundant data items represents those of the plurality of data items to which the redundant data item is connected by first and second edges; and forming an encoded message including the plurality of data items and the plurality of redundant data items.

21. A method of encoding a message according to claim 20, wherein the minimum number of first edges is 2.

22. A method of encoding a message according to claim 20, wherein:

the distribution of numbers of first edges is computed by $2^i+1$, where i is a number of first edges within the range of different numbers of first edges.

23. A method of encoding a message according to claim 20, wherein:

the maximum number of first edges is D+1;

a constant N equals +1/D; and the distribution of numbers of first edges is computed by $N/i(i-1)$ where i is a number of first edges within the range of different numbers of first edges.

24. A method of encoding a message according to claim 20, wherein:

the numbers of first edges includes 3, 5, 9, 17 and 33.

25. A method of encoding a message according to claim 20, wherein:

the numbers of first edges are distributed equally.

26. A method of encoding a message according to claim 20, wherein:

the associated number of first edges for each data item within the plurality of data items is established by random assignment of the different numbers of first edges to respective of the plurality of data items so as to provide the first distribution of the numbers of first edges; and the associated number of second edges for each redundant data item within the plurality of redundant data items is established by random assignment of the different numbers of second edges to respective of the plurality of data items so as to provide the second distribution of the numbers of second edges.

27. A method of encoding a message according to claim 20, wherein:

the second distribution of different numbers of second edges is determined by computing $\rho$ using the formula $\rho(1-\alpha\lambda(1-x))>x$ for all $x\in[0,1]$, where $\rho$ corresponds to the second distribution of different numbers of second edges, $\lambda$ corresponds to the first distribution of different numbers of first edges, and $\alpha$ corresponds to the maximum number of data items which are recoverable.

28. A method of encoding a message according to claim 27, wherein the computation of $\rho$ is performed using a standard binary search for $\alpha$ using linear programming to determine if there is a $\rho$ corresponding to $\alpha$ for a fixed $\lambda$.

29. A method of encoding a message according to claim 27, wherein the computation of ρ is limited to a selected range of different numbers of second edges.

30. A method of encoding a message according to claim 27, wherein the computation of ρ is limited to a selected number of different numbers of second edges.

31. A method of encoding a message according to claim 27, wherein:

ρ is initially computed using a first number of x values and is then computed using a second number of x values; and the second number is greater than the first number.

32. A method of encoding a message according to claim 20, wherein the second distribution of different numbers of second edges is determined such that a maximum number of data items are recoverable.

33. A method of encoding a message according to claim 20, wherein:

the plurality of data items includes a first number of data items;

the plurality of redundant data items includes a second number of redundant data items;

the first number being larger than the second number; and the maximum number of second edges is equal to the maximum number of first edges multiplied by a factor, the numerator of which is the first number and the denominator of which is the second number.

34. A method of encoding a message according to claim 20, wherein each second edge is randomly connected to a respective one of the first edges.

35. A method of encoding a message according to claim 20, wherein each of the plurality of redundant data items is an exclusive-or of the plurality of data items to which the redundant data item is connected by first and second edges.

* * * * *

UNITED STATES PATENT AND TRADEMARK OFFICE
CERTIFICATE OF CORRECTION

PATENT NO : 6,081,909
DATED : June 27, 2000
INVENTOR(S): Luby et al.

It is certified that an error appears in the above-identified patent and that said Letters Patent are hereby corrected as shown below:

Claim 23, Line 4 (Column 28, Line 30), should read:

--a constant N equals 1+1/D; and--

Signed and Sealed this

Seventeenth Day of April, 2001

Attest:

NICHOLAS P. GODICI

Attesting Officer     Acting Director of the United States Patent and Trademark Office